US009515257B2

(12) United States Patent
Hersam et al.

(10) Patent No.: US 9,515,257 B2
(45) Date of Patent: Dec. 6, 2016

(54) GATE-TUNABLE ATOMICALLY-THIN MEMRISTORS AND METHODS FOR PREPARING SAME AND APPLICATIONS OF SAME

(71) Applicant: NORTHWESTERN UNIVERSITY, Evanston, IL (US)

(72) Inventors: Mark C. Hersam, Wilmette, IL (US); Vinod K. Sangwan, Syracuse, NY (US); Deep M. Jariwala, Evanston, IL (US); In Soo Kim, Woodridge, IL (US); Tobin J. Marks, Evanston, IL (US); Lincoln J. Lauhon, Chicago, IL (US)

(73) Assignee: NORTHWESTERN UNIVERSITY, Evanston, IL (US)

( * ) Notice: Subject to any disclaimer, the term of this patent is extended or adjusted under 35 U.S.C. 154(b) by 0 days.

(21) Appl. No.: 15/045,822

(22) Filed: Feb. 17, 2016

(65) Prior Publication Data
US 2016/0248007 A1    Aug. 25, 2016

Related U.S. Application Data

(60) Provisional application No. 62/118,687, filed on Feb. 20, 2015.

(51) Int. Cl.
*H01L 45/00* (2006.01)
*H01L 27/16* (2006.01)
*H01L 27/24* (2006.01)

(52) U.S. Cl.
CPC ....... *H01L 45/1206* (2013.01); *H01L 27/2463* (2013.01); *H01L 45/1253* (2013.01); *H01L 45/142* (2013.01); *H01L 45/143* (2013.01); *H01L 45/1616* (2013.01); *H01L 45/1625* (2013.01)

(58) Field of Classification Search
CPC ............. H01L 45/142; H01L 45/1253; H01L 27/2463; H01L 45/1625; H01L 45/1206; H01L 45/1616; H01L 45/143
See application file for complete search history.

(56) References Cited

U.S. PATENT DOCUMENTS

| 2005/0285096 A1 | 12/2005 | Kozicki |
| 2011/0017977 A1 | 1/2011 | Bratkovski et al. |
| 2011/0240947 A1* | 10/2011 | Yang ............ H01L 45/1246 257/3 |
| 2013/0026434 A1* | 1/2013 | Yang ............ H01L 27/2472 257/1 |
| 2014/0346423 A1 | 11/2014 | Driscoll et al. |

OTHER PUBLICATIONS

Korean Intellectual Property Office (ISA/KR), "International Search Report for PCT/US2016/018257", Korea, Jun. 29, 2016.
Linn, E., Rosezin, R., Kügeler, C. & Waser, R. Complementary resistive switches for passive nanocrossbar memories. Nature Mater., 9 403-406 (2010).

(Continued)

*Primary Examiner* — Karen Kusumakar
(74) *Attorney, Agent, or Firm* — Locke Lord LLP; Tim Tingkang Xia, Esq.

(57) ABSTRACT

In one aspect of the invention, the memristor includes a monolayer film formed of an atomically thin material, where the monolayer film has at least one grain boundary (GB), a first electrode and a second electrode electrically coupled with the monolayer film to define a memristor channel therebetween, such that the at least one GB is located in the memristor channel, and a gate electrode capacitively coupled with the memristor channel.

42 Claims, 24 Drawing Sheets

(56) References Cited

OTHER PUBLICATIONS

Theis, T. N. & Solomon, P. M. In quest of the next switch: Prospects for greatly reduced power dissipation in a successor to the silicon field-effect transistor Proc. IEEE, 98 2005-2014 (2010).
Waser, R. & Aono, M. Nanoionics-based resistive switching memories. Nature Mater., 6 833-840 (2007).
Yang, J. J., Strukov, D. B. & Stewart, D. R. Memristive devices for computing. Nature Nanotech., 8 13-24 (2013).
Chua, L. Memristor-the missing circuit element. IEEE Trans. Circuit Theory, 18 507-519 (1971).
Strukov, D. B., Snider, G. S., Stewart, D. R. & Williams, R. S. The missing memristor found. Nature, 453 80-83 (2008).
Chua, L. Resistance switching memories are memristors. Appl. Phys. A, 102 765-783 (2011).
Borghetti, J., et al. 'Memristive' switches enable 'stateful' logic operations via material implication. Nature, 464 873-876 (2010).
Yang, J. J., et al. Memristive switching mechanism for metal/oxide/metal nanodevices. Nature Nanotech., 3 429-433 (2008).
Jariwala, D., Sangwan, V. K., Lauhon, L. J., Marks, T. J. & Hersam, M. C. Emerging device applications for semiconducting two-dimensional transition metal dichalcogenides. ACS Nano, 8 1102-1120 (2014).
van der Zande, A. M., et al. Grains and grain boundaries in highly crystalline monolayer molybdenum disulphide. Nature Mater, 12 554-561 (2013).
Radisavljevic B., Radenovic A., Brivio J., Giacometti V. & Kis A. Single-layer $MoS_2$ transistors. Nature Nanotech., 6 147-150 (2011).
Pickett, M. D., Borghetti, J., Yang, J. J., Medeiros-Ribeiro, G. & Williams, R. S. Coexistence of memristance and negative differential resistance in a nanoscale metal-oxide-metal system. Adv. Mater., 23 1730-1733 (2011).
Kia, Y., He, W., Chen, L., Meng, X. & Liu, Z. Field-induced resistive switching based on space-charge-limited current. Appl. Phys. Lett., 90 022907 (2007).
Ghatak, S. & Ghosh, A. Observation of trap-assisted space charge limited conductivity in short channel $MoS_2$ transistor. Appl. Phys. Lett., 103 122103 (2013).
Azizi, A., et al. Dislocation motion and grain boundary migration in two-dimensional tungsten disulphide. Nature Commun., 5 (2014).
Najmaei, S., et al. Vapour phase growth and grain boundary structure of molybdenum disulphide atomic layers. Nature Mater., 12 754-759 (2013).
Chen, M., et al. Multibit data storage states formed in plasma-treated $MoS_2$ transistors. ACS Nano, 8 4023-4032 (2014).
Kim, I. S., et al. Influence of stoichiometry on the optical and electrical properties of chemical vapor deposition derived $MoS_2$. ACS Nano, 8 10551-10558 (2014).
Nan, H., et al. Strong photoluminescence enhancement of $MoS_2$ through defect engineering and oxygen bonding. ACS Nano 5738-5745 (2014).
Shen, X., Puzyrev, Y. S. & Pantelides, S. T. Vacancy breathing by grain boundaries—a mechanism of memristive switching in polycrystalline oxides. MRS Commun., 3 167-170 (2013).

Kim, S., Choi, S. & Lu, W Comprehensive physical model of dynamic resistive switching in an oxide memristor. ACS Nano, 8 2369-2376 (2014).
Jariwala, D., et al. Band-like transport in high mobility unencapsulated single-layer $MoS_2$ transistors. Appl. Phys. Lett., 102 173107 (2013).
Najmaei, S., et al. Electrical transport properties of polycrystalline monolayer molybdenum disulfide. ACS Nano doi: 10.1021/nn501701a (2014).
Chang, S., et al. Occurrence of both unipolar memory and threshold resistance switching in a NiO film. Phys. Rev. Lett., 102 026801 (2009).
Yang, Y., Sheridan, P. & Lu, W. Complementary resistive switching in tantalum oxide-based resistive memory devices. Appl. Phys. Lett., 100 203112 (2012).
Park, J.-W., et al. Resistive switching characteristics and set-voltage dependence of low-resistance state in sputter-deposited $SrZrO_3$:Cr memory films. J. Appl. Phys., 99 (2006).
Aoki, Y., et al. Bulk mixed ion electron conduction in amorphous gallium oxide causes memristive behaviour. Nature Commun. doi: 10.1038/ncomms4473 (2014).
Likharev, K. K. Hybrid CMOS/nanoelectronic circuits: Opportunities and challenges. J. Nanoelect. & Optoelec., 3 203-230 (2008).
Linn, E., Rosezin, R., Tappertzhofen, S., Böttger, U. & Waser, R. Beyond von Neumann—logic operations in passive crossbar arrays alongside memory operations. Nanotechnology, 23 305205 (2012).
Snider, G. S. Self-organized computation with unreliable, memristive nanodevices. Nanotechnology, 18 365202 (2007).
Xia, Q., et al. Memristor—CMOS hybrid integrated circuits for reconfigurable logic. Nano Lett., 9 3640-3645 (2009).
Sangwan, V. K., et al. Low-frequency electronic noise in single-layer $MoS_2$ transistors. Nano Lett., 13 4351-4355 (2013).
Yin, X., et al. Edge nonlinear optics on a $MoS_2$ atomic monolayer. Science, 344 488-490 (2014).
Zhang, Y., et al. Controlled Growth of High-Quality Monolayer $WS_2$ Layers on Sapphire and Imaging Its Grain Boundary. ACS Nano, 7 8963-8971 (2013).
Ly, T. H., et al. Observing Grain Boundaries in CVD-Grown Monolayer Transition Metal Dichalcogenides. ACS Nano, 8 11401-11408 (2014).
Burnett, T., Yakimova, R. & Kazakova, O. Mapping of local electrical properties in epitaxial graphene using electrostatic force microscopy. Nano Lett., 11 2324-2328 (2011).
Mak, K. F., Lee, C., Hone, J., Shan, J. & Heinz, T. F. Atomically thin $MoS_2$: A new direct-gap semiconductor. Phys. Rev. Lett., 105 136805 (2010).
Ma, Q., et al. Controlled argon beam-induced desulfurization of monolayer molybdenum disulfide. J. Phys.: Condens. Matter, 25 252201 (2013).
Lee, C., et al. Anomalous lattice vibrations of single-and few-layer $MoS_2$. ACS Nano, 4 2695-2700 (2010).
Tongay, S., et al. Defects activated photoluminescence in two-dimensional semiconductors: interplay between bound, charged, and free excitons. Scientific Reports, 3 2657 (2013).

\* cited by examiner

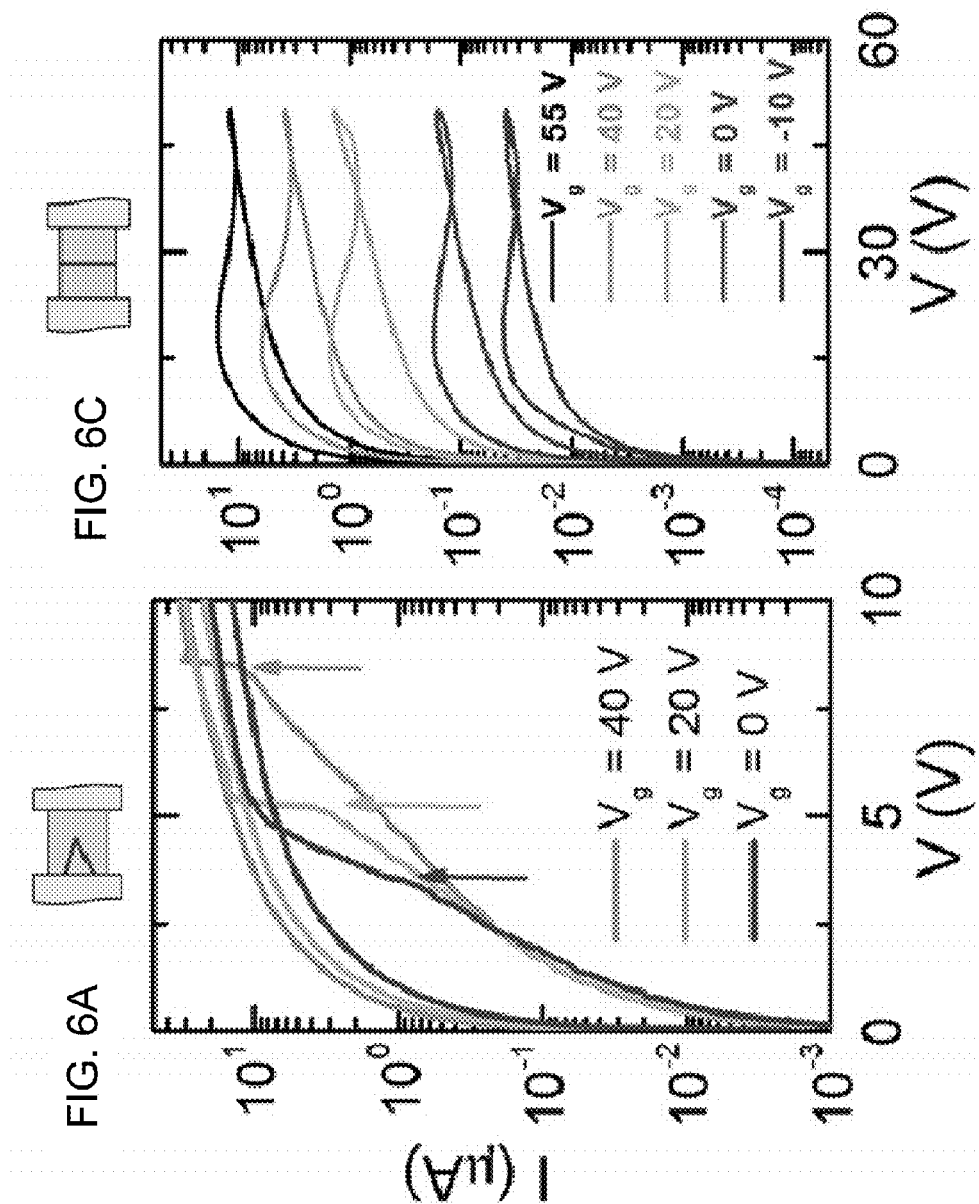

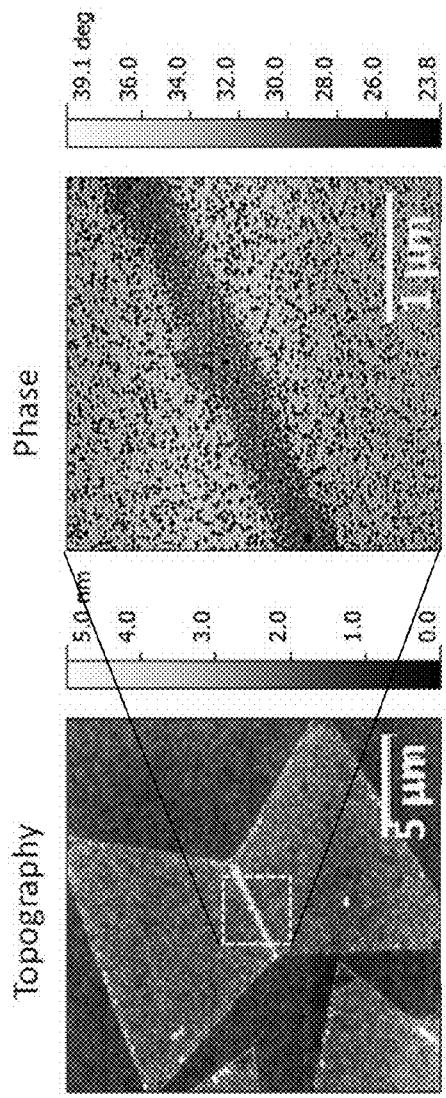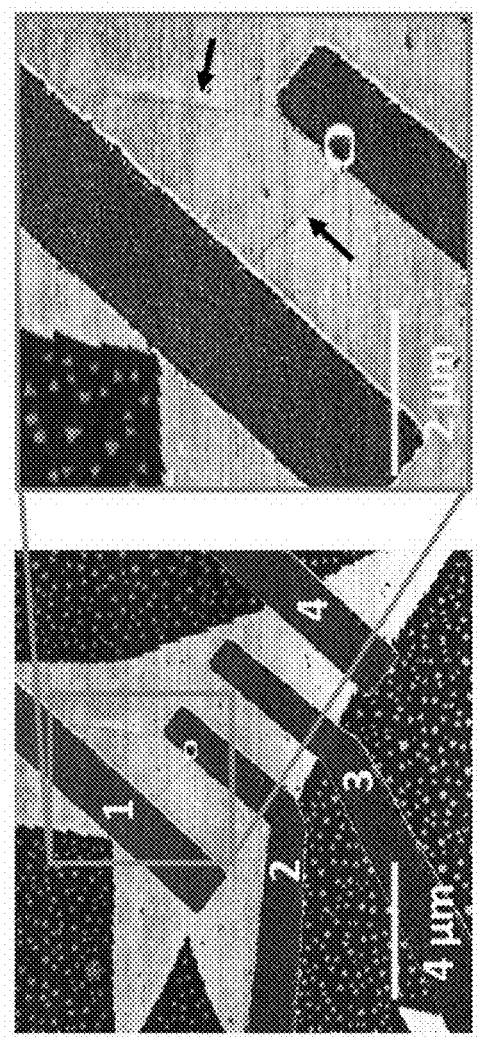
FIG. 10A  FIG. 10B  FIG. 10C  FIG. 10D

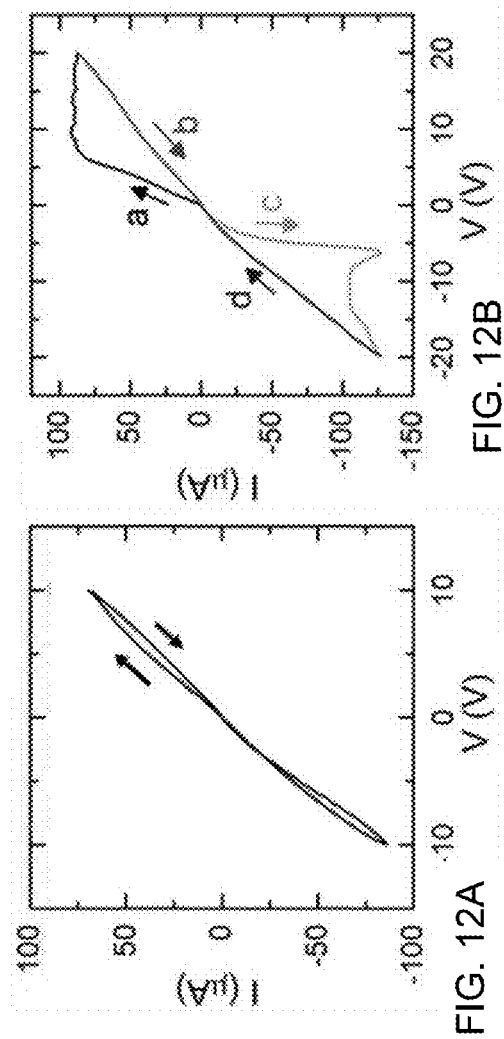
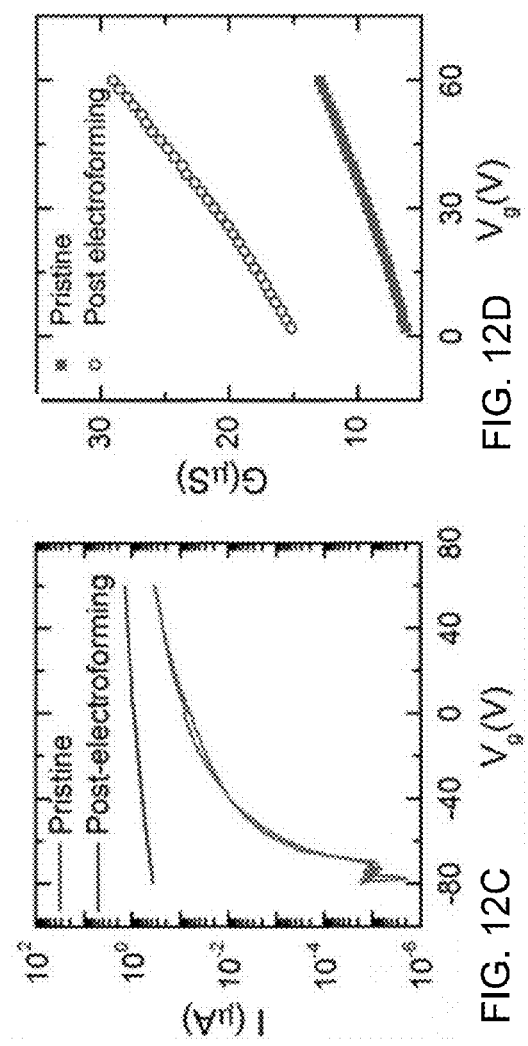
FIG. 12A  FIG. 12B  FIG. 12C  FIG. 12D

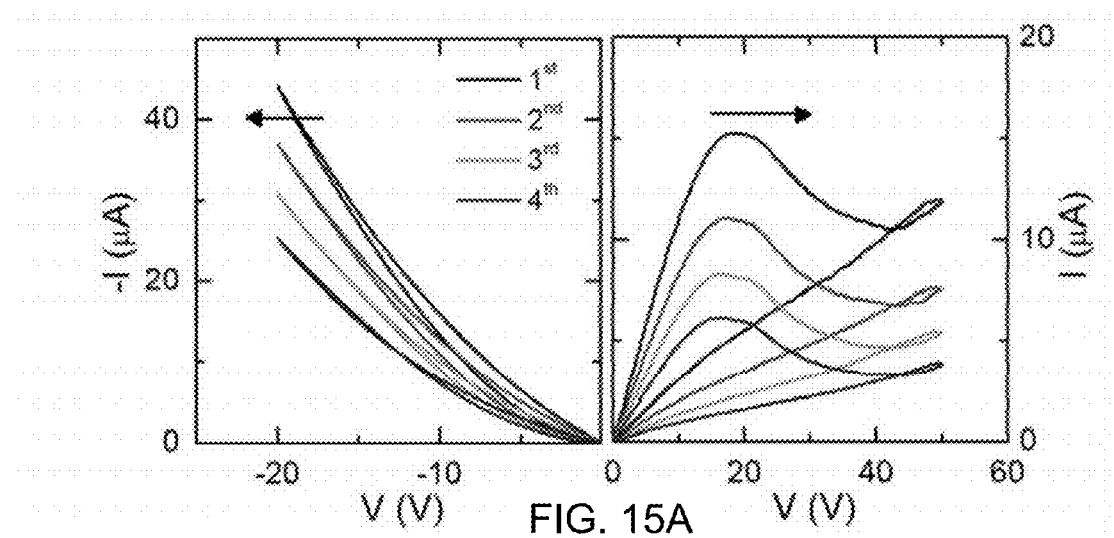
FIG. 15A
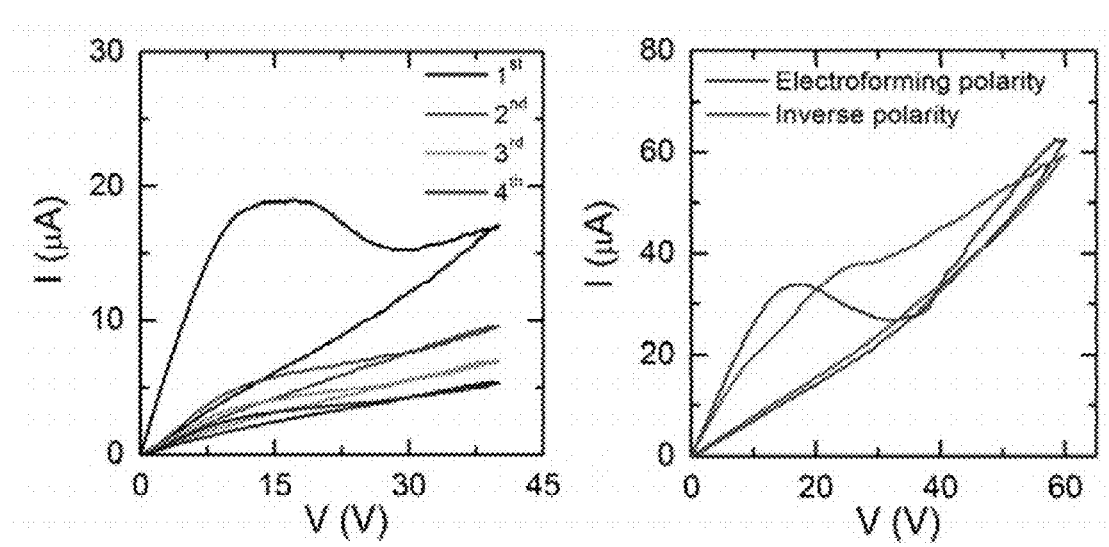
FIG. 15B
FIG. 15C

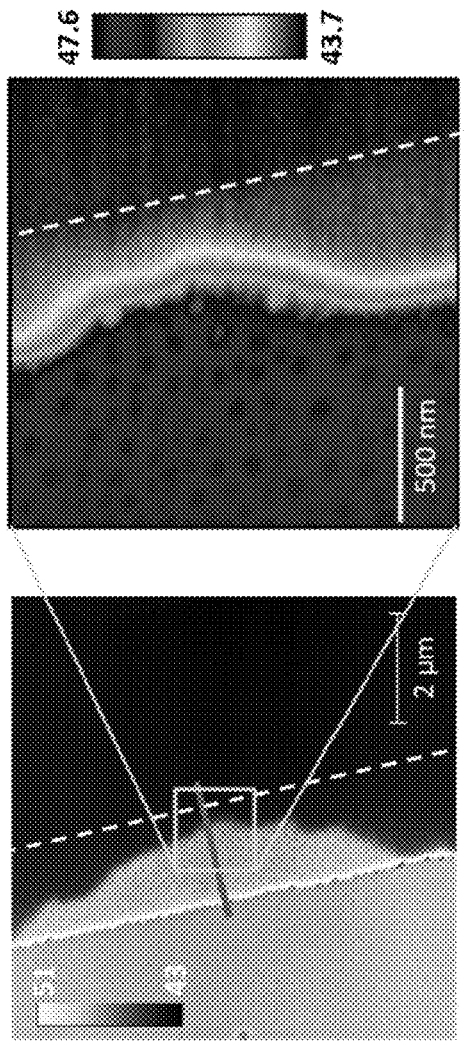
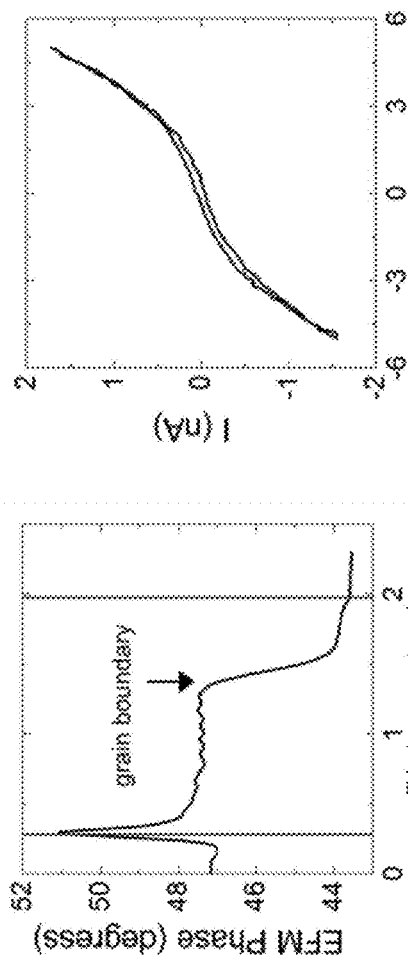
FIG. 19A
FIG. 19B
FIG. 19C
FIG. 19D

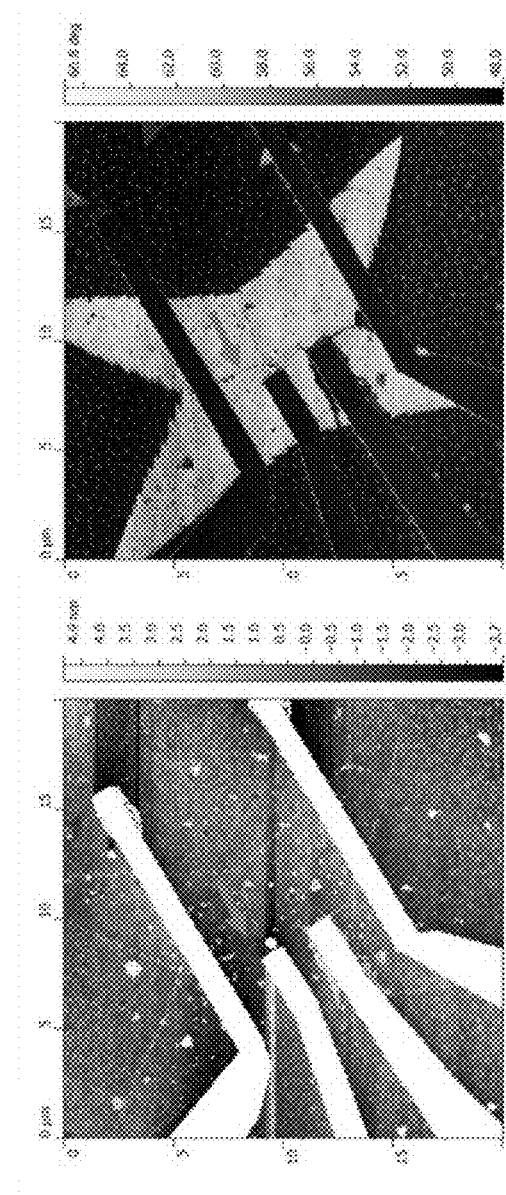
FIG. 22A
FIG. 22B
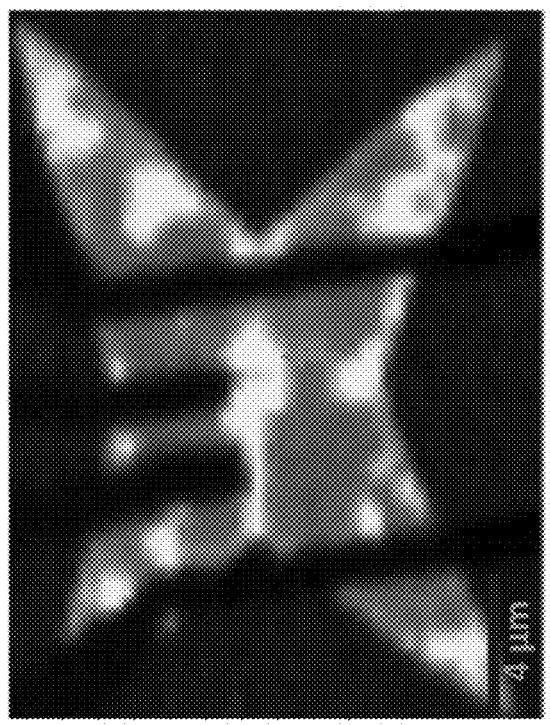
FIG. 22C

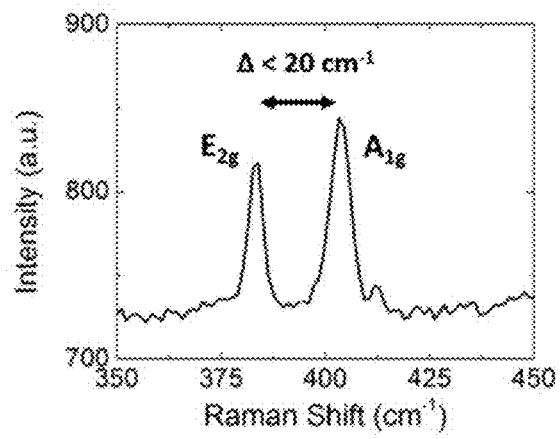
FIG. 24A
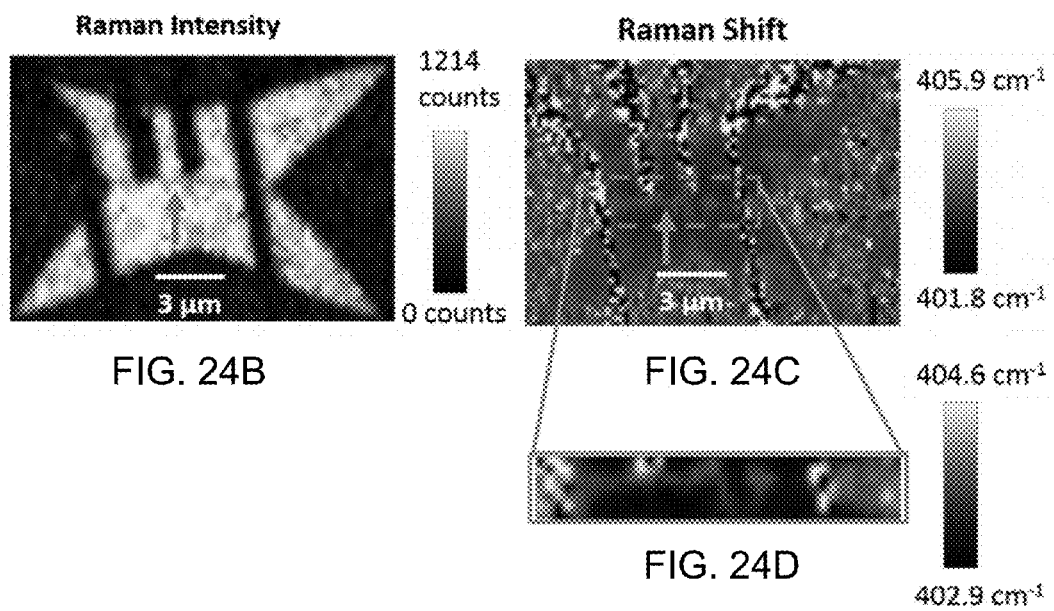
FIG. 24B
FIG. 24C
FIG. 24D

GATE-TUNABLE ATOMICALLY-THIN MEMRISTORS AND METHODS FOR PREPARING SAME AND APPLICATIONS OF SAME

CROSS-REFERENCE TO RELATED PATENT APPLICATION

This application claims priority to and the benefit of, pursuant to 35 U.S.C. §119(e), U.S. provisional patent application Ser. No. 62/118,687, filed Feb. 20, 2015, entitled "GATE-TUNABLE ATOMICALLY-THIN MEMRISTORS AND METHODS FOR PREPARING SAME AND APPLICATIONS OF SAME," by Mark C. Hersam et al., which is incorporated herein in its entirety by reference.

Some references, which may include patents, patent applications and various publications, are cited and discussed in the description of this invention. The citation and/or discussion of such references is provided merely to clarify the description of the present invention and is not an admission that any such reference is "prior art" to the invention described herein. All references cited and discussed in this specification are incorporated herein by reference in their entireties and to the same extent as if each reference was individually incorporated by reference. In terms of notation, hereinafter, "[n]" represents the nth reference cited in the reference list. For example, [10] represents the 10th reference cited in the reference list, namely, Jariwala, D., Sangwan, V. K., Lauhon, L. J., Marks, T. J. & Hersam, M. C. Emerging device applications for semiconducting two-dimensional transition metal dichalcogenides. *ACS Nano*, 8 1102-1120 (2014).

STATEMENT AS TO RIGHTS UNDER FEDERALLY-SPONSORED RESEARCH

This invention was made with government support under DMR-1121262 awarded by the National Science Foundation and N00014-14-1-0669 awarded by the Office of Naval Research. The government has certain rights in the invention.

FIELD OF THE INVENTION

The invention relates generally to memristors, and more particularly to gate-tunable atomically-thin memristors that are based on grain boundaries and fabricating methods and applications of the same.

BACKGROUND OF THE INVENTION

The background description provided herein is for the purpose of generally presenting the context of the present invention. The subject matter discussed in the background of the invention section should not be assumed to be prior art merely as a result of its mention in the background of the invention section. Similarly, a problem mentioned in the background of the invention section or associated with the subject matter of the background of the invention section should not be assumed to have been previously recognized in the prior art. The subject matter in the background of the invention section merely represents different approaches, which in and of themselves may be inventions. Work of the presently named inventors, to the extent it is described in the background of the invention section, as well as aspects of the description that may not otherwise qualify as prior art at the time of filing, are neither expressly nor impliedly admitted as prior art against the present invention.

Continued progress in high-speed computing depends on breakthroughs in both materials synthesis and device architectures [1-4]. The performance of logic and memory can be significantly enhanced by introducing a memristor [5, 6], a two-terminal device with internal resistance that depends on the history of external bias voltage [5-7]. State-of-the-art memristors, based on metal-insulator-metal (MIM) structures with insulating oxides such as $TiO_2$, are limited by a lack of control over filament formation and external control of switching voltage [3, 4, 6, 8, 9].

Therefore, a heretofore unaddressed need exists in the art to address the aforementioned deficiencies and inadequacies.

SUMMARY OF THE INVENTION

One of the objectives of this invention is to provide a new class of memristors based on grain boundaries (GBs) in atomically thin film devices. Specifically, the resistance of grain boundaries emerging from contacts can be easily and repeatedly modulated, with switching ratios up to about $10^3$ and dynamic negative differential resistance. Furthermore, the atomically thin nature of the thin film enables tuning of the SET voltage by a third gate terminal in a field-effect geometry, providing new functionality not observed in other known memristive devices.

In one aspect, the invention relates to a memristor. In one embodiment, the memristor includes a substrate having a first surface and an opposite, second surface, a monolayer film formed of an atomically thin material on the first surface of the substrate, where the monolayer film has at least one grain boundary (GB), a first electrode and a second electrode spatial-apart formed on the first surface of the substrate and electrically coupled with the monolayer film to define a memristor channel in the monolayer film between the first and second electrodes, such that the at least one GB is located in the memristor channel, and a gate electrode formed on the second surface of the substrate and capacitively coupled with the memristor channel.

In one embodiment, the atomically thin material comprises $MoS_2$, $MoSe_2$, $WS_2$, $WSe_2$, or related two-dimensional materials.

In one embodiment, the substrate is an oxidized silicon ($SiO_2$) substrate or other dielectrics (e.g. alumina, hafnia, zirconia) on a conductive substrate (e.g., metals).

In one embodiment, the gate electrode is formed of highly doped silicon (Si) or other conductors (e.g., metals).

In one embodiment, the first and second electrodes are formed of a same metallic material or different metallic materials. In one embodiment, the first and second electrodes are formed of gold (Au), titanium (Ti), and/or other conductors (e.g., metals).

In one embodiment, a resistance of the at least one GB is repeatably modulatable.

In one embodiment, the memristor is gate-tunable, where a SET voltage of the memristor is tunable by a gate voltage applied to the gate electrode.

In one embodiment, the memristor is conditioned to a switching mode by an electroforming process, where the switching mode is a bipolar mode, or a unipolar.

In one embodiment, the memristor is an intersecting-GB memristor, where the at least one GB comprises two or more GBs connected to only one of the first and second electrodes.

In one embodiment, the intersecting-GB memristor is turned into an ON state during a SET process, and an OFF state during a RESET process.

In one embodiment, the memristor is a bridge-GB memristor, where the at least one GB connects and bridges the first and second electrodes. In one embodiment, the at least one GB is parallel to the memristor channel.

In one embodiment, the memristor is a bisecting-GB memristor, where the at least one GB is across the memristor channel and connects to none of the first and second electrodes. In one embodiment, the at least one GB is perpendicular to the channel.

In another aspect, the invention relates to a memristor. In one embodiment, the memristor includes a monolayer film formed of an atomically thin material, where the monolayer film has at least one GB, and a first electrode and a second electrode electrically coupled with the monolayer film to define a memristor channel therebetween, such that the at least one GB is located in the memristor channel.

In one embodiment, the atomically thin material comprises $MoS_2$, $MoSe_2$, $WS_2$, $WSe_2$, or related two-dimensional materials.

In one embodiment, the first and second electrodes are formed of a same metallic material or different metallic materials. In one embodiment, the first and second electrodes are formed of Au, Ti, and/or other conductors (e.g., metals).

In one embodiment, the memristor further includes a gate electrode capacitively coupled with the memristor channel. In certain embodiments, the gate electrode is formed of highly doped Si or other conductors (e.g., metals).

In one embodiment, the memristor may also include a dielectric layer formed between the monolayer film and the gate electrode. In one embodiment, the dielectric layer is formed of $SiO_2$ or other dielectrics (e.g. alumina, hafnia, zirconia) on a conductive substrate (e.g., metals).

In one embodiment, a resistance of the at least one GB is repeatably modulatable.

In one embodiment, the memristor is gate-tunable, where a SET voltage of the memristor is tunable by a gate voltage applied to the gate electrode.

In one embodiment, the memristor is conditioned to a switching mode by an electroforming process, where the switching mode is a bipolar mode, or a unipolar.

In one embodiment, the memristor is a bisecting-GB memristor, where the at least one GB is across the memristor channel and connects to none of the first and second electrodes.

In one embodiment, the memristor is an intersecting-GB memristor, where the at least one GB comprises two or more GBs connected to only one of the first and second electrodes.

In one embodiment, the memristor is a bridge-GB memristor, where the at least one GB connects and bridges the first and second electrodes.

In certain aspects of the invention, a circuitry and/or an electronic device includes one or more memristors as disclosed above.

In one aspect, the invention relates to a method for fabricating a memristor. In one embodiment comprises growing a monolayer film on a substrate, where the monolayer film has at least one GB, and depositing a first electrode and a second electrode on the substrate, where the first and second electrodes are electrically coupled with the monolayer film to define a memristor channel therebetween such that the at least one GB is located in the memristor channel.

In one embodiment, the method further comprises forming a gate electrode on the substrate such that the substrate is positioned between the gate electrode and the monolayer film, where the gate electrode is capacitively coupled with the memristor channel.

In one embodiment, the method further comprises conditioning the memristor with an electroforming process.

In one embodiment, the growing step is performed by chemical vapor deposition, and the depositing step is performed by thermal evaporation.

In one embodiment, the monolayer film comprises an atomically thin material of $MoS_2$, $MoSe_2$, $WS_2$, $WSe_2$, or related two-dimensional materials.

In one embodiment, the substrate is an $SiO_2$ substrate or other dielectrics (e.g. alumina, hafnia, zirconia) on a conductive substrate (e.g., metals).

In one embodiment, the gate electrode is formed of highly doped Si or other conductors (e.g., metals).

In one embodiment, the first and second electrodes are formed of a same metallic material or different metallic materials. In one embodiment, the first and second electrodes are formed of Au, Ti and/or other conductors (e.g., metals).

These and other aspects of the invention will become apparent from the following description of the preferred embodiment taken in conjunction with the following drawings, although variations and modifications therein may be affected without departing from the spirit and scope of the novel concepts of the invention.

BRIEF DESCRIPTION OF THE DRAWINGS

The accompanying drawings illustrate one or more embodiments of the invention and, together with the written description, serve to explain the principles of the invention. Wherever possible, the same reference numbers are used throughout the drawings to refer to the same or like elements of an embodiment.

FIG. 2A is a schematic of the intersecting-GB $MoS_2$ memristor with two grain boundaries connected to one of the electrodes and intersecting at a vertex within the channel. FIG. 2B shows partial I-V characteristics of an electroformed intersecting-GB memristor (channel length L=7 μm) obtained immediately after the electroforming process. The SET process occurs at $V_{SET}$=8.3 V with abrupt two-fold increase in current. The inset of FIG. 2B shows full I-V characteristics of one switching cycle. Measurements were performed at a sweep rate of 1 V/sec and gate voltage $V_g$=40 V under vacuum (pressure<2×10$^{-5}$ Torr). The voltage was swept in the order 0 V→20 V→0 V→-20 V→0 V, as shown by the colored arrows with the four sweeps labeled as a, b, c, and d. FIG. 2C is a log-log plot of the sweeps a and b from FIG. 2B showing space-charge limited and ohmic transport in sweeps a and b, respectively. Sweep a also shows ohmic I-V behavior at low bias (V<0.5 V). The inset shows a zoomed-in I-V curve from the inset of FIG. 2B near zero bias, revealing conductance values in OFF (HRS) and ON (LRS) states.

FIGS. 3A and 3C are respectively a schematic of the bridge-GB memristor and the bisecting-GB memristor, respectively. FIG. 3B shows a partial I-V characteristic of an electroformed bridge-GB memristor (L=7.5 µm; FIG. 3D shows a partial I-V characteristic of an electroformed bisecting-GB memristor at $V_g$=55 V showing a broad current peak followed by an NDR regime. The inset of FIG. 3D shows the full I-V characteristics of one switching cycle. Bias sweeps were conducted in the order a-b-c-d, as indicated by the colored arrows (sweep rate=2 V/sec).

FIG. 4A is an AFM phase image of an $MoS_2$ flake with multiple grain boundaries. The dashed white lines indicate the location of the electrode edges after device fabrication shown in FIG. 4B. One grain boundary (highlighted by white arrows) is bisecting the channel while another grain boundary (highlighted by a black arrow) touches the lower electrode edge. FIG. 4B is an AFM phase image of the device after a series of 12 sweep cycles in the range of 40 V to −40 V (sweep rate=1 V/s). White arrows in FIGS. 4A-4B show that the grain boundaries have migrated by up to 3 µm. The scale bars show the phase angles in degrees.

FIGS. 5A-5G show electrostatic force microscopy (EFM) and spatially-resolved PL images of memristors according to embodiments of the invention. FIG. 5A shows a schematic of the EFM measurement of the channel of a biased bisecting-GB memristor under an inert environment. Bias voltages of the tip and drain electrode are varied while the source electrode and back gate Si are grounded. FIG. 5B shows an AFM phase image of an electroformed bisecting-GB device showing a grain boundary (highlighted by a black arrow) dividing the channel into two regions connected to 'drain' and 'source' electrodes, respectively. The scale bar is 2 µm. FIGS. 5C-5E are corresponding EFM phase image of the device from FIG. 5B at tip biases $V_{tip}$=5 V, 0 V, and 2.5 V, respectively. The scale bars at the top right corners represent EFM phase in degrees. The lateral scale bars in bottom left corners are 2 µm. Device bias conditions are: $V_{drain}$=5 V and $V_{source}$=$V_{gate}$ 0 V. The dotted lines highlight the metal-$MoS_2$ junctions with less contrast. FIG. 5F shows an AFM phase image of an electroformed bridge-GB memristor with a grain boundary connecting both of the electrodes (highlight by a dark arrow). Note that only the electrodes "1" and "4" of the van der Pauw geometry were used for electrical measurement while electrodes 2 and 3 were kept floating. FIG. 5G is a spatial mapping of the area under the photoluminescence (PL) excitonic peaks A and B of the $MoS_2$ device from FIG. 5F showing increased PL intensity in the grain boundary (the dark arrow). The scale bar is 4 µm.

FIGS. 6A-6D show gate-tunability of an intersecting-GB memristor and a bisecting-GB memristor according to embodiments of the invention. FIGS. 6A and 6C are respectively a schematic of the intersecting-GB memristor and the bisecting-GB memristor, respectively. FIG. 6B is a log-linear plot showing I-V characteristics of an intersecting-GB memristor at different $V_g$. The full V sweep range is 20 to −20 V. Switching SET voltage (shown by colored arrows at $V_{SET}$=3.5, 5, and 8 V) is controlled by $V_g$. FIG. 6D is a log-linear plot of I-V characteristics (V>0 V) of a bisecting-GB memristor at different $V_g$. The full V sweep range is 50 to −20 V. Negative bias sweep range is limited to −20 V to avoid dielectric breakdown between the gate and the drain electrode. Current in both the LRS and HRS is modulated by three orders of magnitude by the gate voltage.

FIG. 10A is an AFM topography image of a $MoS_2$ flake grown under relatively high sulfur vapor pressure showing large contrast at the boundary where two triangular islands merge according to embodiments of the invention. FIG. 10B is a zoomed-in AFM phase image of the region in the box in FIG. 10A showing large phase contrast at the grain boundary of width about 400 nm. FIG. 10C is an AFM phase image of an electroformed intersecting-GB memristor. FIG. 10D is a zoomed-in part of the image shown by the box in FIG. 10C showing two intersecting grain boundaries connected to electrode '1' but not reaching to electrode '4'.

FIGS. 12A and 12B show the first and the second electroforming bias sweeps of a bridge-GB device, respectively. FIG. 12C is two-terminal I-$V_g$ characteristics for the bridge-GB device at V=50 mV. FIG. 12D is four-terminal G-$V_g$ (I=100 nA) characteristics of the device for $V_g$>0 before and after the electroforming process.

FIG. 15A is I-V characteristics of a bisecting-GB memristor with four bias sweeps in both polarities. FIG. 15B is I-V characteristics of the device in four sweeps of only positive polarity. FIG. 15C is I-V characteristics of the device with interchanged and original electroforming electrode configurations.

FIG. 19A is an EFM phase image of the bisecting-GB memristor shown in FIG. 5C at the following biasing conditions: V$_{drain}$=5 V, V$_{tip}$=V$_{source}$=V$_g$=0 V. Dashed white line shows the edge of the contact. FIG. 19B is a zoomed-in EFM phase image of the grain boundary enclosed by the light blue rectangle in FIG. 19A in rainbow color scale. Granular features on the left portion of the image are from processing residues. FIG. 19C is a phase profile along the dark blue line in FIG. 19A showing variation across metal-MoS$_2$ edges and the grain boundary. Vertical red lines correspond to the edges of the contacts. The large peak in phase at the left contact edge is an artifact of the scanning direction from left to right. FIG. 19D is I-V characteristics of the device in a N$_2$ environment at V$_g$=0 V.

FIGS. 22A and 22B are AFM topography and phase images of the bridge-GB memristor shown in FIG. 3A, respectively. Scales on the top and left edges are in micrometers. FIG. 22C is a spatial map of the integrated area under the PL peaks A and B (range 585-715 nm).

FIG. 24A is a Raman spectrum of a bridge-GB memristor in a region away from the grain boundary. FIG. 24B is a spatial map of the Raman intensity of a bridge-GB memristor showing increased in the grain boundary highlighted by a light blue arrow. FIG. 24C is a spatial map of the Raman shift showing a blue shift of about 1.7 cm$^{-1}$ in the grain boundary. FIG. 24D is a zoomed-in map of the Raman shift in the grain boundary enclosed by the dashed rectangle in FIG. 24C.

DETAILED DESCRIPTION OF THE INVENTION

Figure 1A:
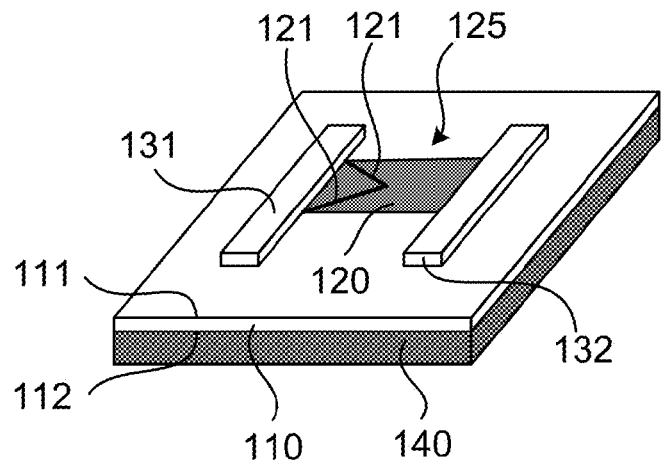
FIGS. 1A-1C show schematically memristors according to various embodiments of the invention.

The invention will now be described more fully hereinafter with reference to the accompanying drawings, in which exemplary embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

The terms used in this specification generally have their ordinary meanings in the art, within the context of the invention, and in the specific context where each term is used. Certain terms that are used to describe the invention are discussed below, or elsewhere in the specification, to provide additional guidance to the practitioner regarding the description of the invention. For convenience, certain terms may be highlighted, for example using italics and/or quotation marks. The use of highlighting has no influence on the scope and meaning of a term; the scope and meaning of a term is the same, in the same context, whether or not it is highlighted. It will be appreciated that same thing can be said in more than one way. Consequently, alternative language and synonyms may be used for any one or more of the terms discussed herein, nor is any special significance to be placed upon whether or not a term is elaborated or discussed herein. Synonyms for certain terms are provided. A recital of one or more synonyms does not exclude the use of other synonyms. The use of examples anywhere in this specification including examples of any terms discussed herein is illustrative only, and in no way limits the scope and meaning of the invention or of any exemplified term. Likewise, the invention is not limited to various embodiments given in this specification.

It will be understood that, as used in the description herein and throughout the claims that follow, the meaning of "a", "an", and "the" includes plural reference unless the context clearly dictates otherwise. Also, it will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the invention.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

It will be further understood that the terms "comprises" and/or "comprising," or "includes" and/or "including" or "has" and/or "having" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

As used herein, the terms "comprising," "including," "carrying," "having," "containing," "involving," and the like are to be understood to be open-ended, i.e., to mean including but not limited to.

The description will be made as to the embodiments of the invention in conjunction with the accompanying drawings. In accordance with the purposes of this disclosure, as embodied and broadly described herein, this disclosure, in certain aspects, relates to gate-tunable atomically-thin memristors that are based on grain boundaries and fabricating methods and applications of the same.

Figure 1B:
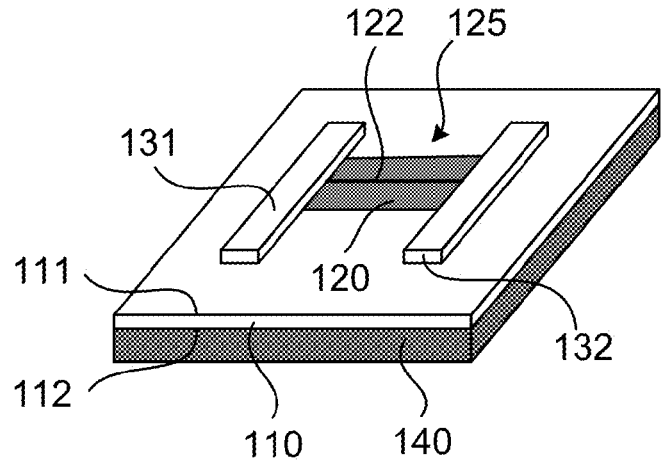
Figure 1C:
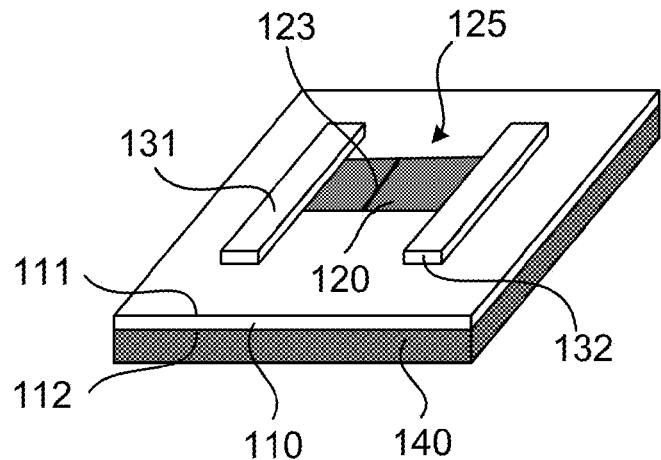

Referring to FIGS. 1A-1C, in certain embodiments, the gate-tunable memristor includes a substrate 110 having a first surface 111 and an opposite, second surface 112, a monolayer film 120 formed of an atomically thin material on the first surface 111 of the substrate 110. The monolayer film 120 has at least one grain boundary (GB), e.g., two GBs 121 shown in FIG. 1A, one GB 122 shown in FIG. 1B and one GB 123 shown in FIG. 1C. The memristor also includes a first electrode 131 and a second electrode 132 spatial-apart formed on the first surface 111 of the substrate 110 and electrically coupled with the monolayer film 120 to define a memristor channel 125 in the monolayer film 120 between the first and second electrodes 131 and 132, such that the at least one GB 121/122/123 is located in the memristor channel 125. Furthermore, the memristor includes a gate electrode 140 formed on the second surface 112 of the substrate 110 and capacitively coupled with the memristor channel 125.

In one embodiment shown in FIG. 1A, the memristor is an intersecting-GB memristor, where the at least one GB 121 has two or more GBs connected to only one of the first and second electrodes 131 and 132, e.g., connected to the first electrode 131. In one embodiment, the intersecting-GB memristor is turned into an ON state during a SET process, and an OFF state during a RESET process.

In one embodiment shown in FIG. 1B, the memristor is a bridge-GB memristor, where the at least one GB 122 connects and bridges the first and second electrodes 131 and 132. In this exemplary embodiment, the at least one GB 122 is parallel to the memristor channel 125.

In one embodiment shown in FIG. 1C, the memristor is a bisecting-GB memristor, where the at least one GB 123 is across the memristor channel 125 and connects to none of the first and second electrodes 131 and 132. In this exemplary embodiment, the at least one GB 123 is perpendicular to the memristor channel 125.

In certain embodiments, the resistance of grain boundaries emerging from contacts can be easily and repeatedly modulated, with switching ratios up to about $10^3$ and dynamic negative differential resistance.

In certain embodiments, the memristor is gate-tunable. The atomically thin nature enables tuning of the SET voltage by a third gate terminal in a field-effect geometry, providing new functionality not observed in other known memristive devices.

In certain embodiments, the memristor is conditioned to a switching mode by an electroforming process, where the switching mode is a bipolar mode, or a unipolar.

In another aspect of the invention, the method for fabricating the above memristor includes the steps of growing a monolayer film on a substrate, and depositing a first electrode and a second electrode on the substrate, where the monolayer film has at least one GB, and the first and second electrodes are electrically coupled with the monolayer film to define a memristor channel therebetween such that the at least one GB is located in the memristor channel.

In certain embodiments, the method further comprises forming a gate electrode on the substrate such that the substrate is positioned between the gate electrode and the monolayer film, where the gate electrode is capacitively coupled with the memristor channel.

In certain embodiments, the method also comprises conditioning the memristor with an electroforming process.

In certain embodiments, the growing step is performed by chemical vapor deposition, and the depositing step is performed by thermal evaporation.

In certain aspects of the invention, a circuitry and/or an electronic device includes one or more memristors as disclosed above.

In certain embodiments, the atomically thin material comprises $MoS_2$, $MoSe_2$, $WS_2$, $WSe_2$, or related two-dimensional materials. The substrate 110 is an oxidized silicon ($SiO_2$) substrate or other dielectrics (e.g. alumina, hafnia, zirconia) on a conductive substrate (e.g., metals). The gate electrode is formed of highly doped silicon (Si) or other conductors (e.g., metals). The first and second electrodes are formed of a same metallic material or different metallic materials. In one embodiment, the first and second electrodes are formed of gold (Au), titanium (Ti), and/or other conductors (e.g., metals).

For further illustration of the invention, the atomically thin material of $MoS_2$, an $SiO_2$ substrate, two Au and Ti electrodes, and a Si gate electrode are used as exemplary examples in the following description. It should be appreciated to one skilled in the art that other materials can also be utilized to practice the invention.

Figure 2A:
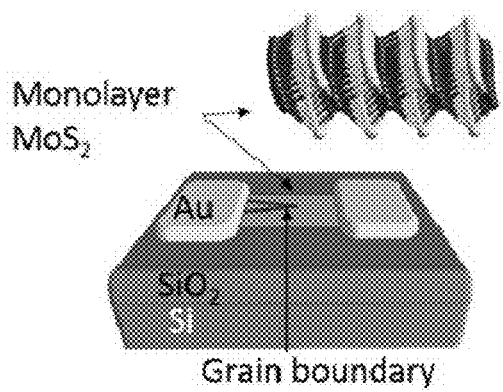
FIGS. 2A-2C show I-V characteristics of an intersecting-GB memristor according to one embodiment of the invention.

In certain embodiments, the memristors were fabricated from monolayer $MoS_2$ films grown on oxidized Si substrates (300 nm $SiO_2$) by chemical vapor deposition sulfurization of $MoO_3$ films. Two Au electrodes on the $MoS_2$ define the memristor channel, and an additional gate electrode (Si) is used to control the SET voltage, as shown in FIG. 2A.

Figure 2B:
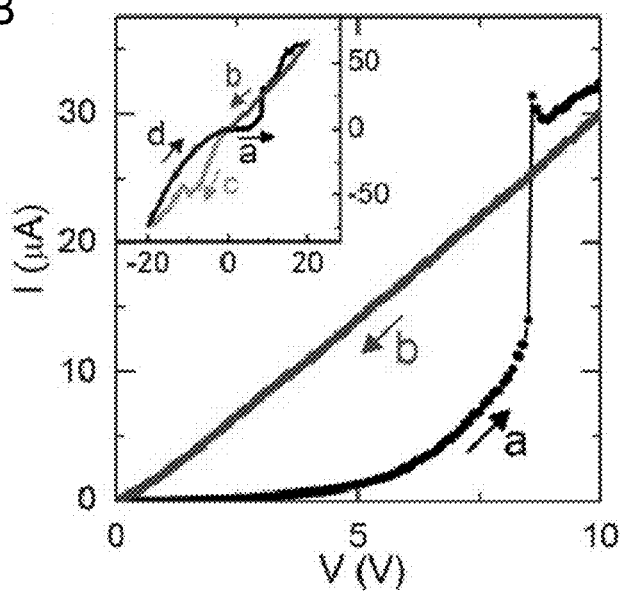
Figure 2C:
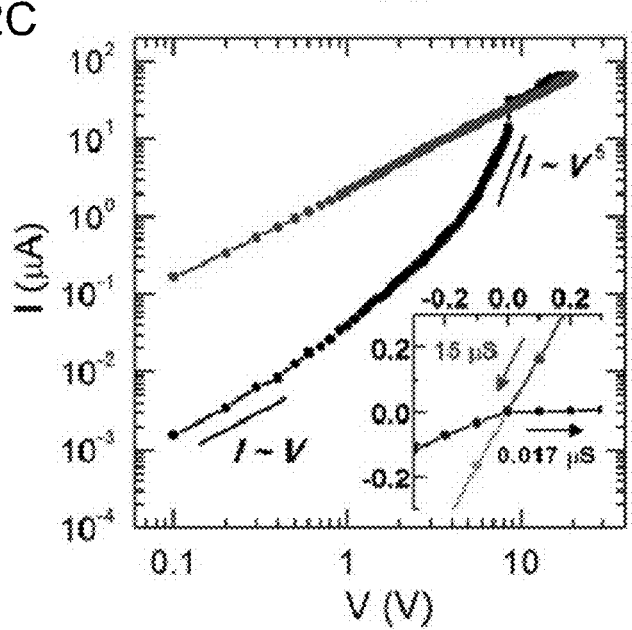

According to embodiments of the invention, the best performing devices have GBs that are connected to only one of the two electrodes, as shown in FIGS. 1A, 2A, 6A and 8B. Such devices are referred as intersecting-GB memristors. As-fabricated devices were preconditioned to a switchable state by an electroforming process that causes irreversible changes in current-voltage (I-V) characteristics. Electroformed intersecting-GB memristors show a high resistance state (HRS) at V=0 V that changes to a low resistance state (LRS) at high bias, following an abrupt increase in current (FIG. 2B, SET process, sweep a). The device stays in the LRS as the voltage is decreased to zero (sweep b). The ratio of resistance in the bistable states at zero bias $R_{HRS}/R_{LRS}$ is about $10^3$ (FIG. 2C, inset). In the negative bias sweep, the device begins in the LRS (sweep c) and then changes to the HRS (RESET process, sweep d). The pinched hysteresis loop in I-V with I=0 at V=0 indicates the presence of a memristive element within the device [5-7]. Furthermore, the device shows a sudden increase in current (conductance $G=\partial I/\partial V=175$ μS) within a single bias step of 0.1 V (FIG. 2B). This current spike is followed by a dynamic negative differential resistance (NDR) that is commonly observed in memristive systems [4, 13]. This dynamic NDR depends on the sweep rate and is therefore different from the static NDR observed in resonant devices [4, 6]. Sweeps a and d are described by $I \approx V^m$ (V<8.5 V, FIG. 2C), where m increases monotonically with bias voltages. This type of dependence is characteristic of space-charge limited current (SCLC), which has been observed in complex-oxide memristors [14] as well as in monolayer $MoS_2$ transistors [15]. The present $MoS_2$ memristors show 100 times smaller SET fields (about $10^4$ V/cm for $V_{SET}$=8.3 V in FIG. 2B) than those in conventional memristors, thereby promising low dynamic power switches and memories (note that the standard operating point of V=I=0 makes the static power of memristors inherently low).

Figure 3A:
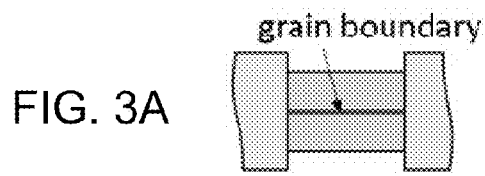
FIGS. 3A-3D show I-V characteristics of a bridge-GB memristor and a bisecting-GB memristor according to embodiments of the invention.
Figure 3B:
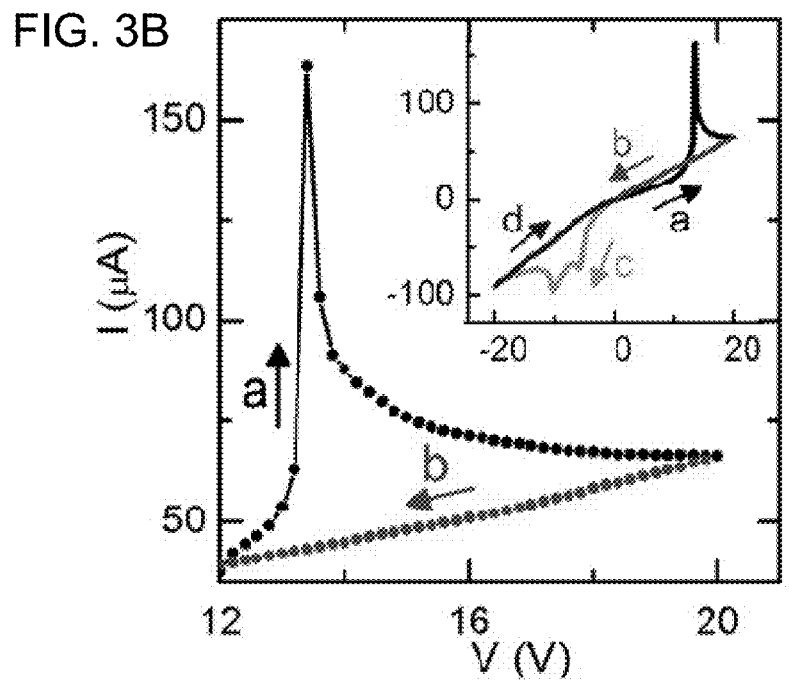

Devices with different grain boundary orientations were analyzed to identify the switching mechanism. The bridge-GB memristor contains a grain boundary parallel to the channel and bridging the two electrodes as schematically shown in FIGS. 1B and 3A. After electroforming, the bridge-GB memristor I-V shows an extremely rapid current increase (G>1 mS, FIG. 3B) followed by NDR that is larger than that observed in intersecting-GB memristors as shown in FIG. 2B. In contrast to intersecting-GB memristors, bridge-GB memristors do not exhibit bistable states of different resistances at V=0 V. Furthermore, the gate voltage modulated current ratio decreases dramatically from about $5 \times 10^4$ in the pristine state to about 2 in the electroformed state as shown in FIG. 12C, which suggests the formation of a highly conducting filament between the electrodes. In contrast, the bisecting-GB memristor schematically shown in FIGS. 1C and 3C features a grain boundary perpendicular to the channel that does not contact either of the electrodes and possesses bipolar resistive switching that shows a broad current peak followed by a slow current decay in the NDR regime with $R_{HRS}/R_{LRS}$ being about 4 at zero bias, as shown in FIG. 3D.

Figures 4A, 4B:
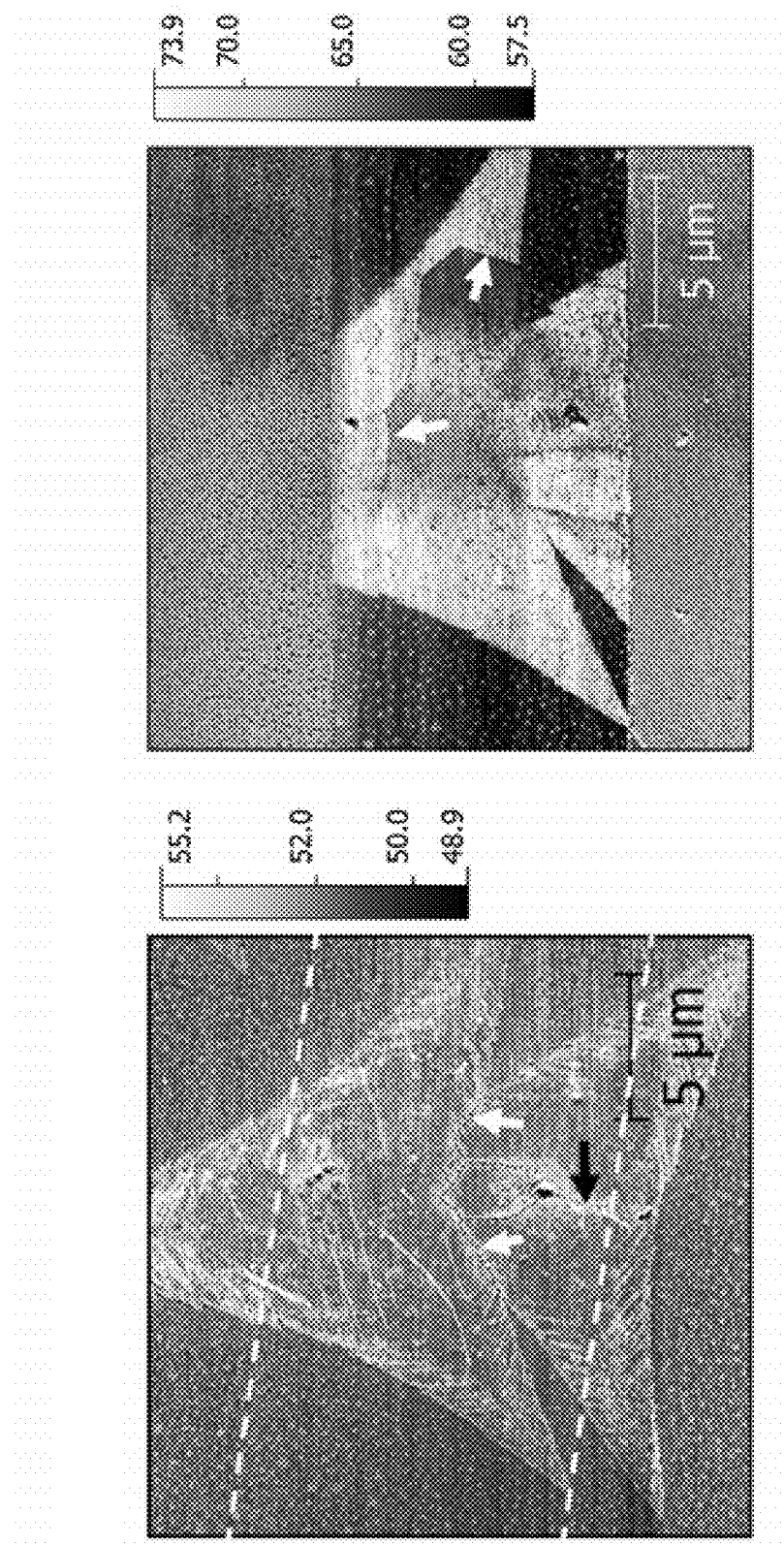
FIGS. 4A-4B show brain boundary migration.

The dependencies of these memristive phenomena on the grain boundary geometry, together with the absence of memristive behavior in control devices without grain boundaries and repeatable multiple sweeps, suggest the following mechanism for the conductance modulation in intersecting-GB memristors. The electroforming process increases the overall resistance of the device in the 'OFF' state by removing mobile dopants from the region between the grain boundary tip and the opposing electrode. During the SET process, dopants migrate from the grain boundary region to the depleted region, thus increasing the conductance (ON). The dopants are driven away from the drain electrode and toward the grain boundary region during the RESET process, turning the device OFF. The power law I-V characteristics (as opposed to exponential I-V), two-terminal versus four-terminal measurements, and comparisons between Au and Ti contacts rule out Schottky barrier formation near contacts via anion segregation, as seen in $TiO_2$ memristors [9]. Direct evidence of grain boundary migration was found in a device containing both a bisecting-GB and a grain boundary connected to one of the electrodes, as shown in FIGS. 4A and 4B. After multiple sweeps at high biases (+/−40 V), the bisecting grain boundary shifted by up to 3 μm. Similar significant motion of extended defects in 2D materials has been observed in atomic scale transmission electron microscopy (TEM) images of migrating dislocations in CVD-grown single-layer $WS_2$ [16].

Referring to FIGS. 5A-5E, electrostatic force microscopy (EFM) and spatially-resolved photoluminescence (PL) spectroscopy are used to further elucidate the switching mechanism in the devices. In contrast to buried MIM memristors, all-surface monolayer $MoS_2$ memristors provide a new platform for in-situ probing of the underlying mechanisms in nanoionic switches. The abrupt change of the cantilever phase in the EFM images of FIGS. 5C-5E and 19A-19B across a bisecting grain boundary indicates that the electrostatic potential drops primarily at the grain boundary (i.e., the grain boundary is resistive). This conclusion is consistent with the overall higher resistance of the bisecting-GB memristor compared to the bridge-GB memristor. However, sulfur vacancies in $MoS_2$ have been shown to accumulate near grain boundaries [11, 17], and both the mid-gap states of sulfur vacancies [11, 18] and the electrons donated by dangling bonds should render the $MoS_2$ regions near grain boundaries more conductive. Therefore, it is expected that the resistance of devices with grain boundaries can be modulated to the extent that sulfur vacancy concentrations in adjacent regions are modulated by vacancy migration. It follows that an electric field applied parallel to an intersecting-GB will promote migration of vacancies between the grain boundary and the depletion region. Circumstantial evidence of the key role of sulfur vacancies is provided by the fact that these memristive phenomena are only observed in devices that are intentionally grown to produce sulfur vacancies according to methods recently reported [19].

Figure 5A:
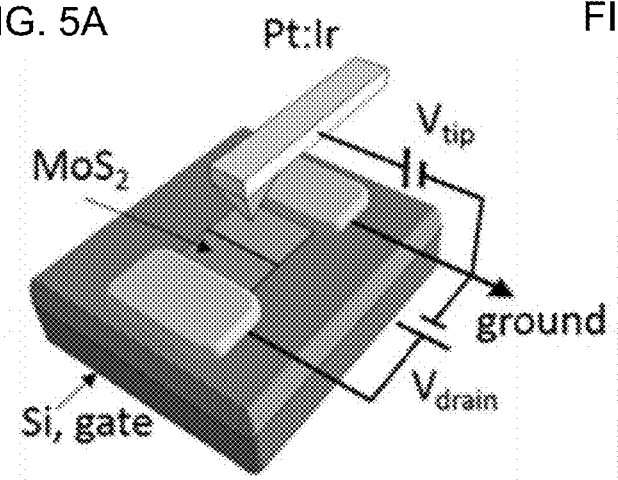
Figure 5B:
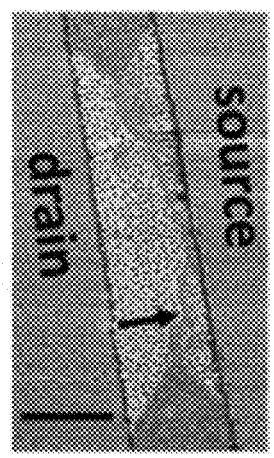
Figure 5C:
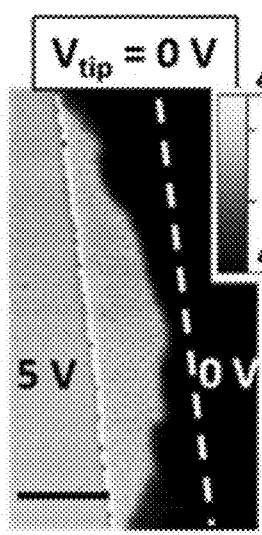
Figure 5D:
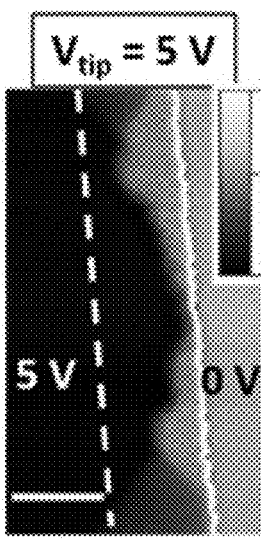
Figure 5E:
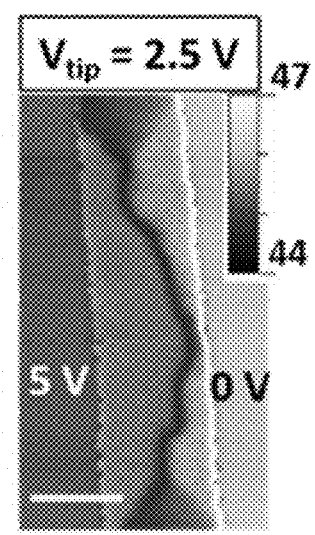
Figure 5F:
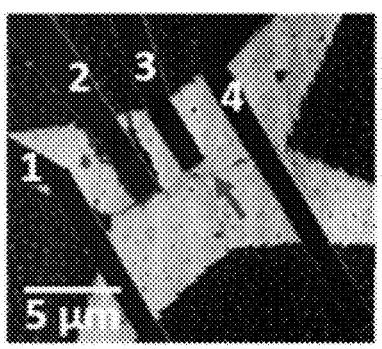
as shown in FIG. 5F) at $V_g$=40 V showing a transient current spike ($V_{SET}$=13.2 V) followed by an NDR regime. The inset of FIG. 3B shows full I-V characteristics of one switching cycle. The voltage sweeps are in the order a-b-c-d, as indicated by the colored arrows (sweep rate=2 V/sec).
Figure 5G:
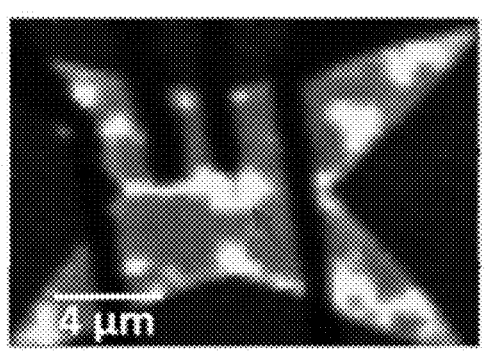

PL and Raman spectroscopy maps of electroformed devices provide additional evidence for higher concentrations of sulfur vacancies near grain boundaries, as shown in FIGS. 5F, 5G, 20B and 20C. First, PL emission is enhanced near grain boundaries in the bridge-GB and intersecting-GB memristors, as shown in FIGS. 5F and 5G, as was also reported previously [11] and associated with sulfur vacancies. In addition, the PL blue-shift and Raman blue-shift are consistent with $O_2$ chemisorption at sulfur vacancies [20]. Thus, spatially resolved analyses confirm that an increased density of defects exists near grain boundaries following electroforming. Sulfur vacancies are the most likely candidates for mobile anionic species within $MoS_2$. Mobile Mo cations are unlikely to be relevant due to the absence of an electrolytic medium or an electrochemically active metal [4].

The proposed migration mechanism of mobile anions can also account for the switching characteristics in the bridge-GB and bisecting-GB memristors. In the bridge-GB memristors, anions segregate near the grain boundary during electroforming, which increases the conductivity of the boundary similar to vacancy migration in ZnO [21], $TiO_2$ [6, 9] and $TaO_x$ memristors [22]. The switching proceeds through a two-step process: first, the region near the grain boundary becomes highly conducting at high bias due to metallic-like transport across interacting defects at high density [23, 24]; second, Joule heating leads to a thermal rupture of the filament inducing NDR similar to threshold switching [4, 13, 25]. Thus, volatile switching and the NDR regime result from the deceasing width of the defect-rich region via the lateral drift of anions [4]. The absence of bistable states at V=0 V in the bridge-GB memristors is akin to complementary resistive switching in $TaO_x$ memristors [26]. In contrast, the broad current peak, NDR features, and asymmetric I-V characteristics [27] of the bisecting-GB memristors are reminiscent of soft switching in non-filamentary $GaO_x$ memristors [28] and Cr-doped $SrZrO_3$ memristors [27]. The hysteretic I-V (FIG. 3D) can be explained by the dynamic and non-linear relation between drift (driven by electric field) and diffusion (driven by the concentration gradient) of anions forming depletion regions on either side of the bisecting grain boundary [6, 7].

In certain embodiments, the invented 3-terminal $MoS_2$ memristors are gate tunable, which has not been observed in previous memristive systems and thus presents new opportunities for memristive circuits and related applications. In the intersecting-GB memristors, the SET voltage ($V_{SET}$) can be varied from 3.5 to 8.0 V by varying the gate bias from 0 to 40 V (FIG. 6A), which suggests that independently addressable local gates in the $MoS_2$ memristors could continuously adjust $V_{SET}$ to afford fault-tolerant architectures [29]. Furthermore, controlled $V_{SET}$ allows additional flexibility in designing complementary and bipolar resistive switching [1, 8, 30]. Furthermore, the bisecting-GB memristors offer an additional gate-tunable functionality, namely that the resistance values in each of the bistable states at zero bias can be controlled by more than three orders of magnitude, while the switching ratio (about 4-6) and shape of the SET curves remain relatively unchanged with gate voltage, as shown in FIG. 6D. This adjustable resistance could be used as continuous-weight synapses in neuromorphic circuits [29, 31]. Independent control of device resistances can also lead to better uniformity and impedance matching between memristive circuits. Gate-tunable memristors further present opportunities for hybrid CMOS-memristor field-programmable architectures [29, 32].

Without intent to limit the scope of the invention, exemplary examples and their related results according to the embodiments of the invention are given below. Note that titles or subtitles may be used in the examples for convenience of a reader, which in no way should limit the scope of the invention. Moreover, certain theories are proposed and disclosed herein; however, in no way they, whether they are right or wrong, should limit the scope of the invention so long as the invention is practiced according to the invention without regard for any particular theory or scheme of action.

Methods

Devices Fabrication and Measurements:

Monolayer $MoS_2$ flakes were grown by chemical vapor deposition [11, 17, 33]. The extent of sulfurization was controlled by heating the sulfur vapor to about 150° C. and by restricting the time of exposure to sulfur vapor to about 3 min. A higher sulfur vapor temperature (about 170° C.) and a longer duration of exposure (about 10 min) results in stoichiometric triangular flakes [33]. As calculated from the shift in the threshold voltage, $MoS_2$ flakes grown at reduced sulfur vapor pressure show a defect-induced doping level of approximately about $1.7 \times 1012$ $cm^{-2}$. Quantitative estimation of the stoichiometry at different growth conditions is reported in [33]. Atomic force microscopy (AFM) and Raman spectroscopy were used to identify monolayer $MoS_2$ and grain boundaries. Devices were fabricated using electron-beam lithography, following a previously reported procedure [34]. Electrodes (70 nm Au/2 nm Ti) were deposited by thermal evaporation. After the lift-off process, the devices were submerged in N-methyl-2-pyrrolidone at about 80° C. for about 30 min to remove processing residues. All electroforming processes and electrical measurements were performed under vacuum (pressure less than about $2 \times 10^{-5}$ Torr) using a LakeShore CRX 4K probe station and Keithley 2400 source-meters.

Scanning Probe Microscopy:

AFM and EFM scans were performed in an Asylum Cypher ES system. All AFM images were taken in a tapping mode using NCHR tips (Nanoworld Inc). The resonance frequency of these cantilevers is about 300 KHz, and the nominal diameter of the tip apex is about 10 nm. Tapping mode imaging is operated in the repulsive regime by maintaining the phase signal below 90 degrees throughout the entire scan. For the EFM imaging, the cantilever amplitude was set to the same value as the tapping mode imaging while maintaining a distance of about 50 nm from the surface to avoid damage to the tip from tall electrodes (about 70 nm). EFM tips (Nano World Point Probe EFM) were monolithic Si coated with PtIr. The typical tip radius and resonant frequency were about 25 nm and about 75 kHz, respectively. EFM scans were captured on wire-bonded devices placed inside an inert environment cell including continuously flowing pure nitrogen. Device electrical biasing was achieved during EFM using Keithley source-meters.

Photoluminescence Spectroscopy:

Micro-photoluminescence measurements were conducted using a confocal Raman system (WITec Alpha 300R) equipped with a 532 nm excitation source. The laser was focused using a 100× objective (NA=0.9), and the power was kept below about 50 µW to avoid laser-induced sample heating/damage. Since the spatial resolution of the system is about 350 nm, a 300 nm step size was used for PL mapping. A 600 g/mm grating dispersed the photons prior to collection by a Si-based CCD camera.

Device Characterization

Identification of $MoS_2$ Grain Boundaries by AFM

AFM imaging facilitated the fabrication of $MoS_2$ memristors with controlled orientation of grain boundaries within the device channels. AFM was used to confirm the thickness of the monolayer flakes. AFM was also found to be an effective tool to visualize grain boundaries in polycrystalline films [19] that are not visible in a standard optical microscope and require more intricate methods such as second harmonic generation microscopy [35].

Figure 7A:
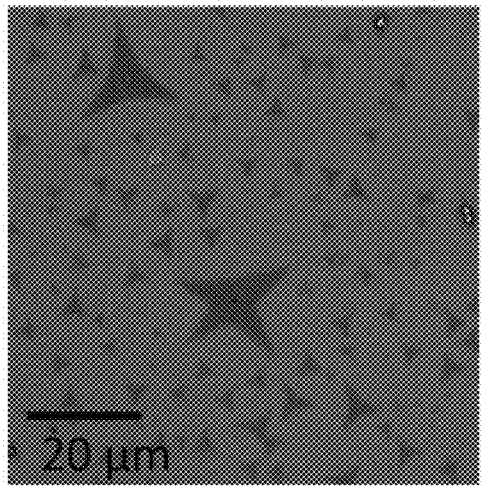
FIG. 7A is an optical micrograph of isolated flakes of monolayer $MoS_2$ grown under relatively low sulfur vapor pressure according to embodiments of the invention.
Figure 7B:
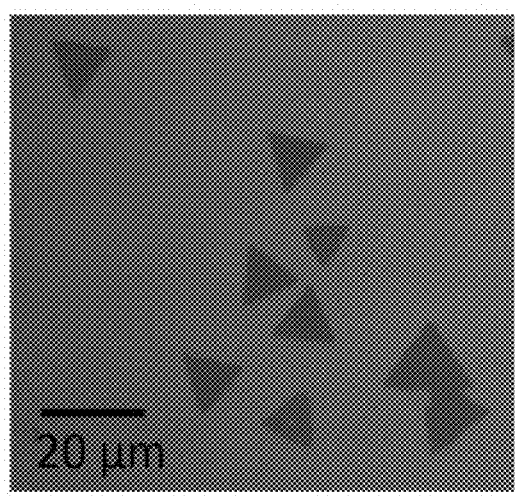
FIG. 7B is an optical micrograph of stoichiometric $MoS_2$ flakes grown under elevated sulfur vapor pressure.
Figure 7C:
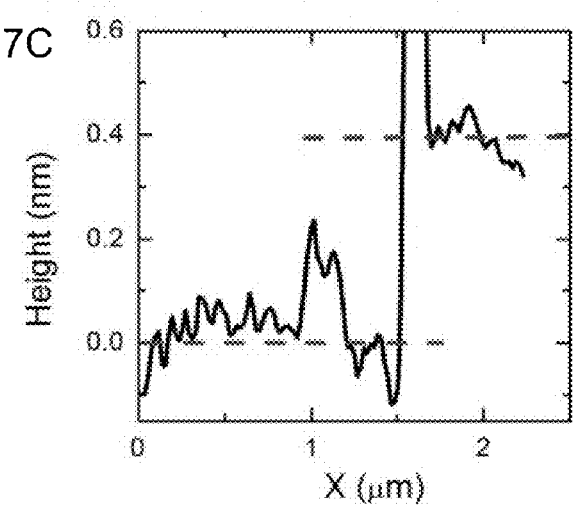
FIG. 7C is a topographic profile along the edge of a $MoS_2$ flake showing that the measured height of monolayer $MoS_2$ is about 0.4 nm.

Monolayer MoS$_2$ flakes grown on 300 nm SiO$_2$/Si substrates by chemical vapor deposition can be readily identified by the optical contrast due to thin film interference, as shown in FIGS. 7A-7C, where FIG. 7A is an optical micrograph of isolated flakes of monolayer MoS$_2$ grown under relatively low sulfur vapor pressure, FIG. 7B is an optical micrograph of stoichiometric MoS$_2$ flakes grown under elevated sulfur vapor pressure, and FIG. 7C is a topographic profile along the edge of a MoS$_2$ flake showing that the measured height of monolayer MoS$_2$ is about 0.4 nm. These individual MoS$_2$ flakes were grown in reduced vapor pressure of sulfur and single grains are shaped as three-point stars [19], which have been reported recently in [36]. In contrast, more stoichiometric MoS$_2$ flakes grown in higher vapor pressure of sulfur are shaped in equilateral triangles, as shown in FIG. 7B, that are also a more commonly reported structure in the literature [11]. The measured flake thickness (0.4 nm), as shown in FIG. 7C, agrees well with the values for monolayer MoS$_2$ reported in the literature [12].

Figure 8A:
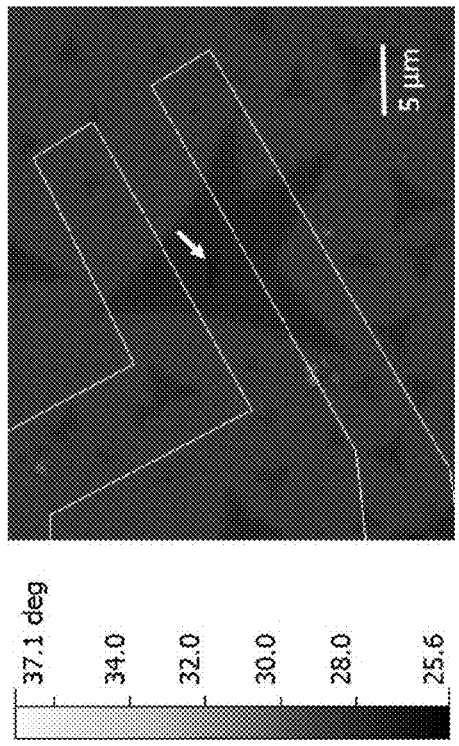
FIG. 8A is an AFM phase image of an $MoS_2$ flake used for an intersecting-GB memristor according to embodiments of the invention. The grain boundary vertex is highlighted by the black arrow.
Figure 8B:
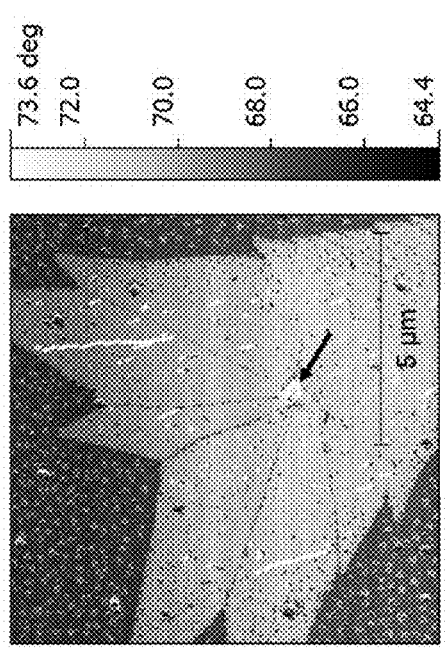
FIG. 8B shows a design of electrodes aligned over the flake.
Figure 8C:
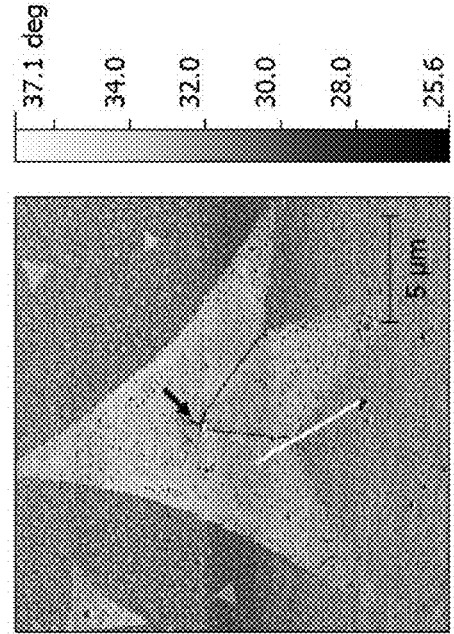
FIG. 8C is an optical image of a fully fabricated intersecting-GB memristor.
Figure 8D:
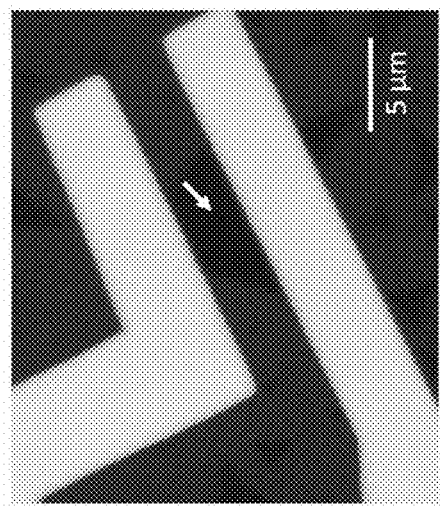
FIG. 8D is an $MoS_2$ flake showing at least 5 grain boundaries intersecting at one vertex.
Figure 9:
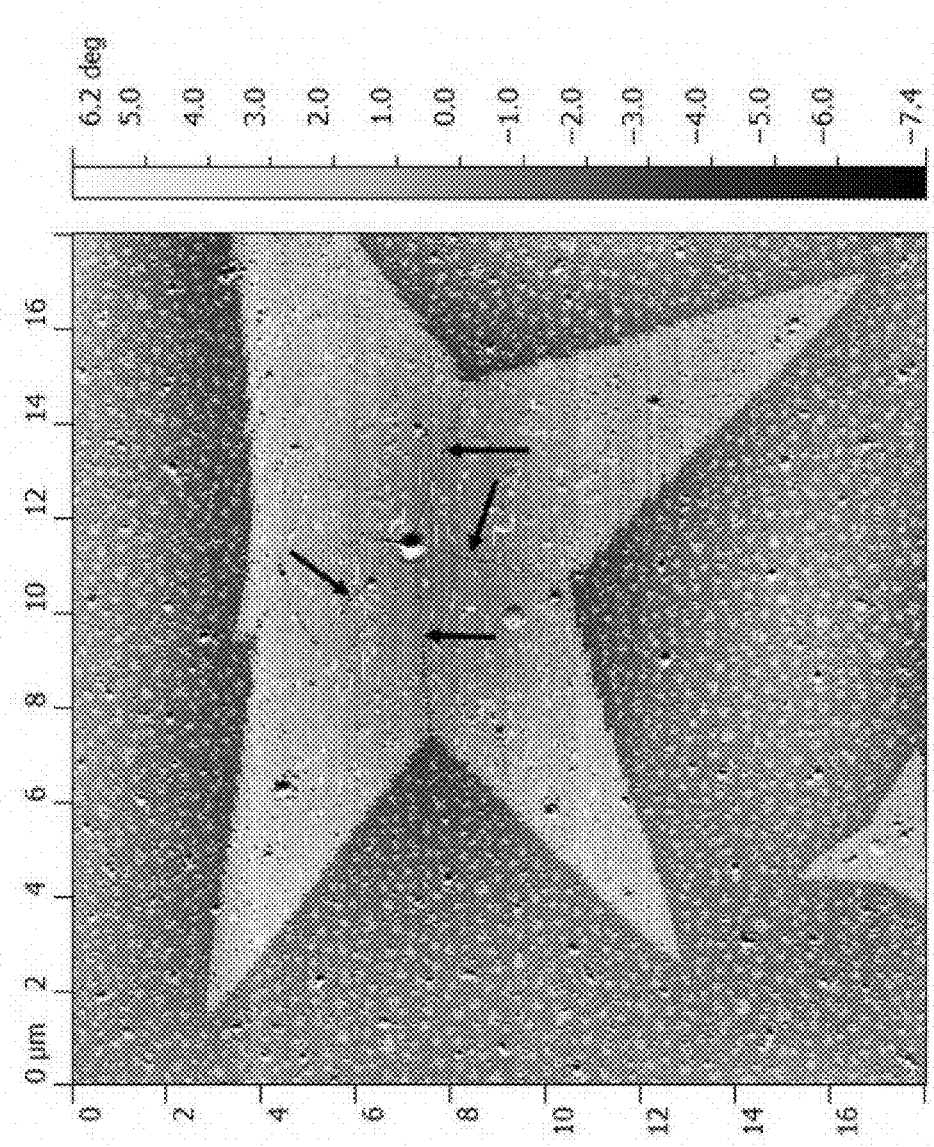
FIG. 9 is an AFM phase image of a typical $MoS_2$ flake used for a bridge-GB memristor according to embodiments of the invention. Four grain boundaries are highlighted by black arrows.

FIG. 8A shows an AFM phase image of a typical MoS$_2$ flake used for an intersecting-GB memristor according to embodiments of the invention. The grain boundary vertex is highlighted by the black arrow. These flakes contain one vertex and at least two grain boundaries that branch out with an angle less than 180° between them. Such flakes have been recently reported in [36]. FIG. 8B shows the design of electrodes on the flake such that the grain boundaries touch one of the electrodes but not the other. FIG. 8C shows an optical image of the fully fabricated device. FIG. 8D shows another example flake where at least 5 grain boundaries branch out from one vertex. MoS$_2$ flakes shown in FIG. 9 with more widely separated prongs show two grain boundaries with an angle close to 180° and these flakes were used for bridge-GB devices, where an AFM phase image of a typical MoS$_2$ flake used for a bridge-GB memristor and four grain boundaries are highlighted by black arrows. One of the prongs in such flakes was used for control devices without any grain boundaries. Since these grain boundaries are found between grains with arbitrary orientations, they are most likely tilt boundaries as opposed to mirror-twin boundaries [11]. These multi-grain flakes were used for the fabrication of MoS$_2$ memristors.

FIGS. 10A and 10B show another example of a grain boundary between two triangular MoS$_2$ flakes grown under higher sulfur vapor pressure [19]. These grain boundary devices revealed negligible hysteresis in I-V characteristics. The grain boundaries in this case show large contrast in both topography and phase images, as shown in FIG. 10A. The topography contrast suggests preferential deposition of excess material at the GBs in as-grown films. Often, phase images of grain boundaries show distinctive contrast spanning several hundreds of nanometers in width, as shown in FIG. 10B, which suggests that these samples have considerably larger regions of defects and vacancies near boundaries. FIGS. 10C and 10D show AFM phase images of an intersecting-GB memristor shown in FIG. 2A. AFM images of grain boundaries on devices likely show decreased topographic contrast due to excess materials being washed off during processing. On the other hand, the phase contrast at GBs of processed films in devices suggests different stoichiometry of the material in the GB regions. Similarly, the introduction of defects in polycrystalline MoS$_2$ via UV treatment has been reported to improve the AFM contrast of GBs [37]. Note that four-terminal van der Pauw devices were fabricated to probe the effect of contacts before and after electroforming processes. However, all electrical characterization of memristors was conducted using only the two main electrodes of the Hall geometry ('1' and '4' shown in FIG. 10C). FIG. 10D is a zoomed-in part of the image shown by the box in FIG. 10C showing two intersecting grain boundaries connected to electrode '1' but not reaching to electrode '4'.

Electroforming Process of MoS$_2$ Memristors

An electroforming process conditions a memristor into its switching mode by inducing irreversible changes that stabilize reversible changes [4, 6, 9]. MoS$_2$ memristors were electroformed by sweeping the bias up to increasingly larger voltages in 1 to 3 cycles at a sweep rate of 1 V/sec, unless noted otherwise.

Figure 11A:
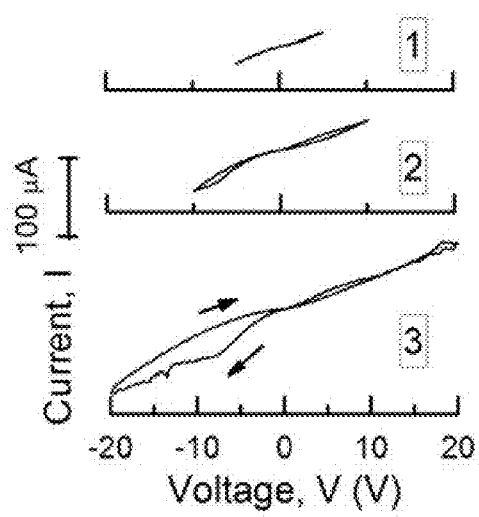
FIG. 11A shows three electroforming sweeps of an intersecting-GB memristor in order from top to bottom. The vertical current scale bar of 100 µA and horizontal voltage scale are common to all plots.
Figure 11B:
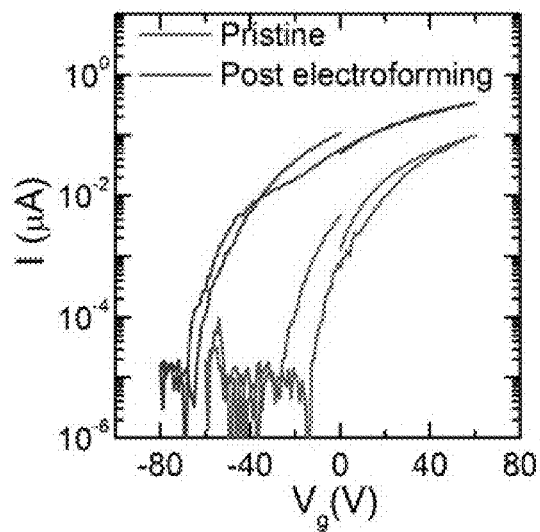
FIG. 11B shows a plot of current (I) versus gate voltage ($V_g$) characteristics at V=50 mV measured between electrodes '1' and '4' in FIG. 10C before and after memristor measurements.
Figure 11C:
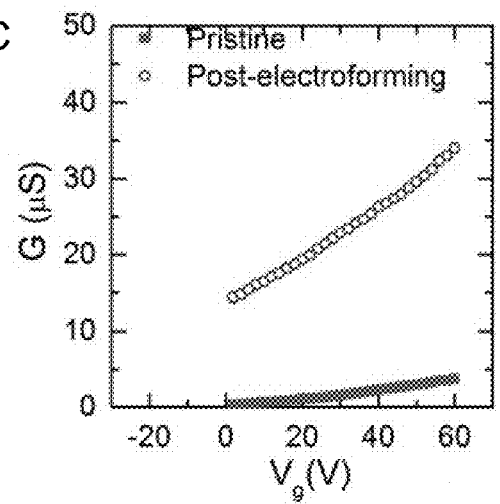
FIG. 11C shows a plot of conductance (G) versus $V_g$ characteristics (I=100 nA) of the device for $V_g$>0 V before and after the electroforming process where the conductance is measured using the four-terminal van der Pauw geometry.

Intersecting-GB Device Electroforming:

FIG. 11A shows three electroforming steps used to precondition the intersecting-GB memristor schematically shown in FIGS. 1A and 2A in the order labeled as '1', '2', and '3' with voltage ranges of ±5, ±10 V, and ±20 V, respectively. The low bias sweep does not show any hysteresis in the I-V curve and causes negligible changes in the device characteristics. However, the bias sweep of ±20 V results in memristive I-V characteristics shown in FIG. 2B that is significantly different from the preceding sweep (FIG. 11A). FIG. 11B shows a plot of current (I) versus gate voltage ($V_g$) characteristics at V=50 mV measured between electrodes '1' and '4' shown in FIG. 10C before and after memristor measurements. Gate-dependent current characteristics (I-$V_g$) show that the electroforming process increases the overall current of the device in accumulation ($V_g > V_{th}$) by at least five times and shifts the turn-on voltage from −22 V to −60 V. FIG. 11C shows a plot of conductance (G) versus $V_g$ characteristics (I=100 nA) of the device for $V_g > 0$ V before and after the electroforming process where the conductance is measured using the four-terminal van der Pauw geometry. The four-terminal van der Pauw measurements of the device before and after the electrical characterization of the memristors are used in order to understand the role of the contacts. A constant current (I) of 100 nA was passed between electrodes "1" and "4" and the voltage (V) between "2" and "3" was measured to obtain conductance (G=I/V) for different $V_g$. Note that four-terminal measurements were limited to $V_g > 0$ V where the device resistance is less than the input impedance limits of the remote preamplifier used in conjunction with a femtoamp Keithley 6430 source-meter. The conductivities estimated from two-terminal and four-terminal conductance measurements are comparable. Furthermore, both the two-terminal and four-terminal conductances of the device improve by the approximately the same proportion after electroforming. Therefore, the dominant impact of the electroforming process is on the channel rather than the contacts. The mechanism is distinct from that of TiO$_2$/TiO$_x$ memristors [9] in which the contact resistance changes by several orders of magnitude during electroforming, and the switching process is enabled by formation of Schottky contacts via migration of oxygen vacancies.

Bridge-GB Device Electroforming:

FIGS. 12A and 12B show two electroforming sweeps of the bridge-GB memristor schematically shown in FIGS. 1B and 3A. The first sweep at low biases shows negligible hysteresis in the I-V characteristics, but the second sweep (±20 V) introduces significant hysteresis. The third bias sweep (±20 V) results in the memristive I-V characteristic, as shown in FIG. 3D. FIG. 12C shows two-terminal I-$V_g$ characteristics for the bridge-GB device at V=50 mV. FIG. 12D shows four-terminal G-$V_g$ (I=100 nA) characteristics of the device for $V_g > 0$ before and after the electroforming process. The two-terminal conductance increases by three-fold after electroforming (FIG. 12C), which is roughly the same factor that is observed for the four-terminal conductance (FIG. 12D). Again, contacts do not appear to play a major role in the memristive response. However, unlike the intersecting-GB memristor, the overall device conductance in depletion ($V_g$=−80 V) increased by a factor of about $10^4$ after electroforming (FIG. 12C), suggesting that the grain-boundary acts as a highly conducting filament between the electrodes. The absence of bi-stable states at V=0 V in bridge-GB devices is due to volatile switching and rapid onset of the dynamic-NDR feature (within 0.1 V). Similar I-V characteristics have been reported for complementary switching in $TaO_x$ memristors that have symmetric channel geometries and involve thermal effects [26].

Figure 3C:
Figure 3D:
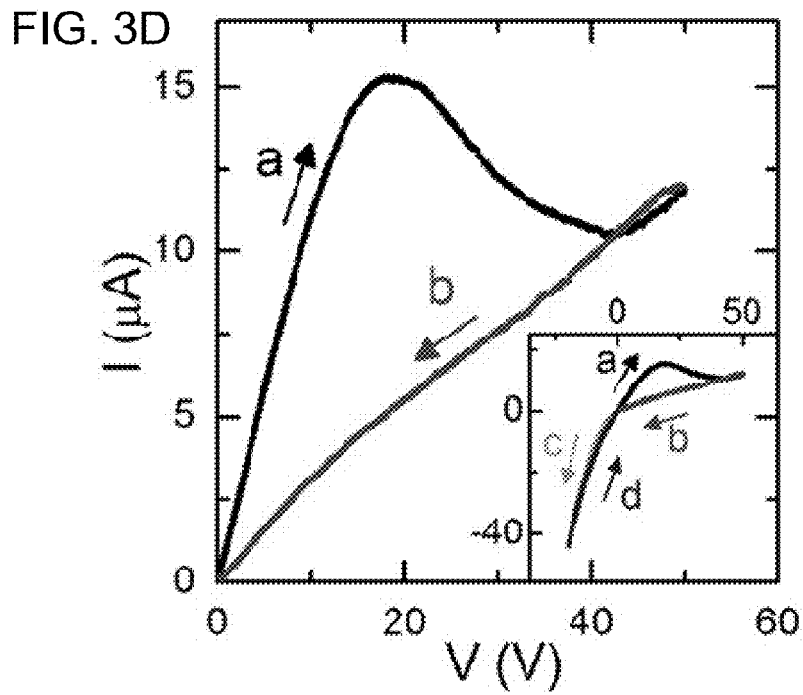
Figure 13A:
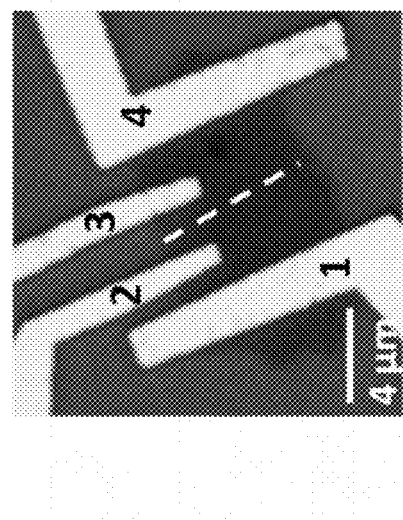
FIG. 13A shows an optical micrograph of the bisecting-GB memristor shown in FIG. 3B. Memristor measurements were conducted between the electrodes '1' and '4' while the electrodes '2' and '3' were kept floating throughout.
Figure 13B:
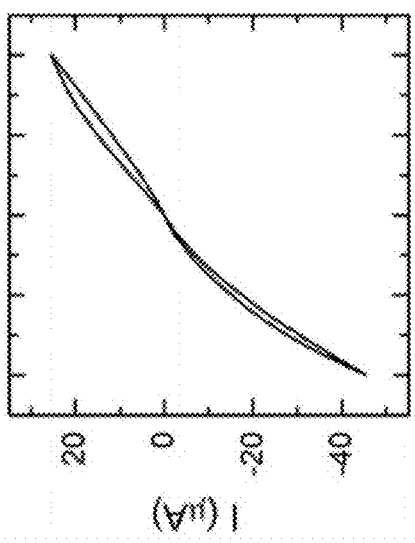
FIGS. 13B and 13C show the first and the second electroforming sweeps of the bisecting-GB memristor, respectively.
Figure 13C:
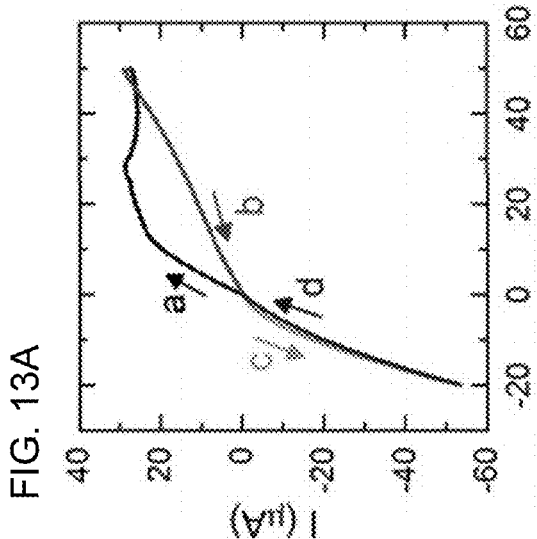
Figure 13D:
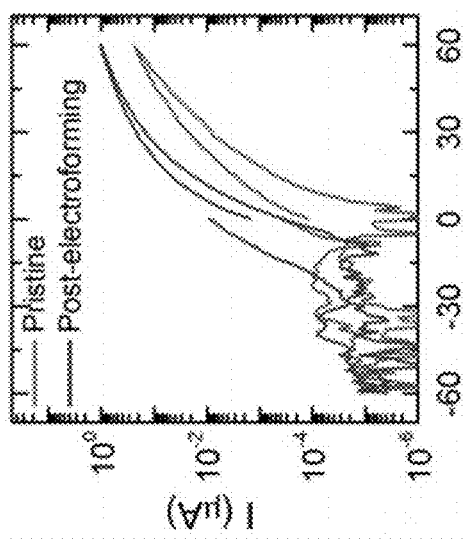
FIG. 13D is two-terminal I-$V_g$ characteristics of the device at V=0.5 V before and after the electroforming process.

Bisecting-GB Device Electroforming:

The electroforming process of the bisecting-GB memristor schematically shown in FIGS. 1C and 3C is also conducted in two steps. FIG. 13A shows an optical micrograph of the bisecting-GB memristor. Memristor measurements were conducted between the electrodes '1' and '4' while the electrodes '2' and '3' were kept floating throughout. FIGS. 13B and 13C show the first and the second electroforming sweeps of the bisecting-GB memristor, respectively. FIG. 13D is two-terminal I-$V_g$ characteristics of the device at V=0.5 V before and after the electroforming process. The second electroforming step (FIG. 13C) shows hysteresis only in the positive bias sweep. However, in contrast to bridge-GB and intersecting-GB memristors, the bisecting-GB memristor I-V characteristics in the third sweep (FIG. 3D) are qualitatively similar to the second electroforming sweep (FIG. 13C). In general, bisecting-GB devices are more resistive than the other two memristor classes and show the onset of a dynamic NDR feature at larger fields. Bisecting-GB devices also show up to an order of magnitude lower conductance in the 'ON' state compared to the conductance of control devices grown in the same growth condition but with a grain boundary. Nevertheless, the electroforming process increases the conductance in accumulation at $V_g$=60 V by five-fold and shifts the turn-on gate voltage from 0 V to −20 V (FIG. 13D). Asymmetric I-V characteristics of bisecting-GB memristors resemble non-filamentary switching characteristics in oxide and perovskite based memristors [27, 28]. Reduced hysteresis for V<0 V in bisecting-GB memristors could also be influenced by the asymmetric electrostatics that results from the finite gate bias in the metal-oxide-semiconductor geometry of these devices.

Effect of Different Contact Metal in $MoS_2$ Memristor Characteristics

Figures 14A, 14B:
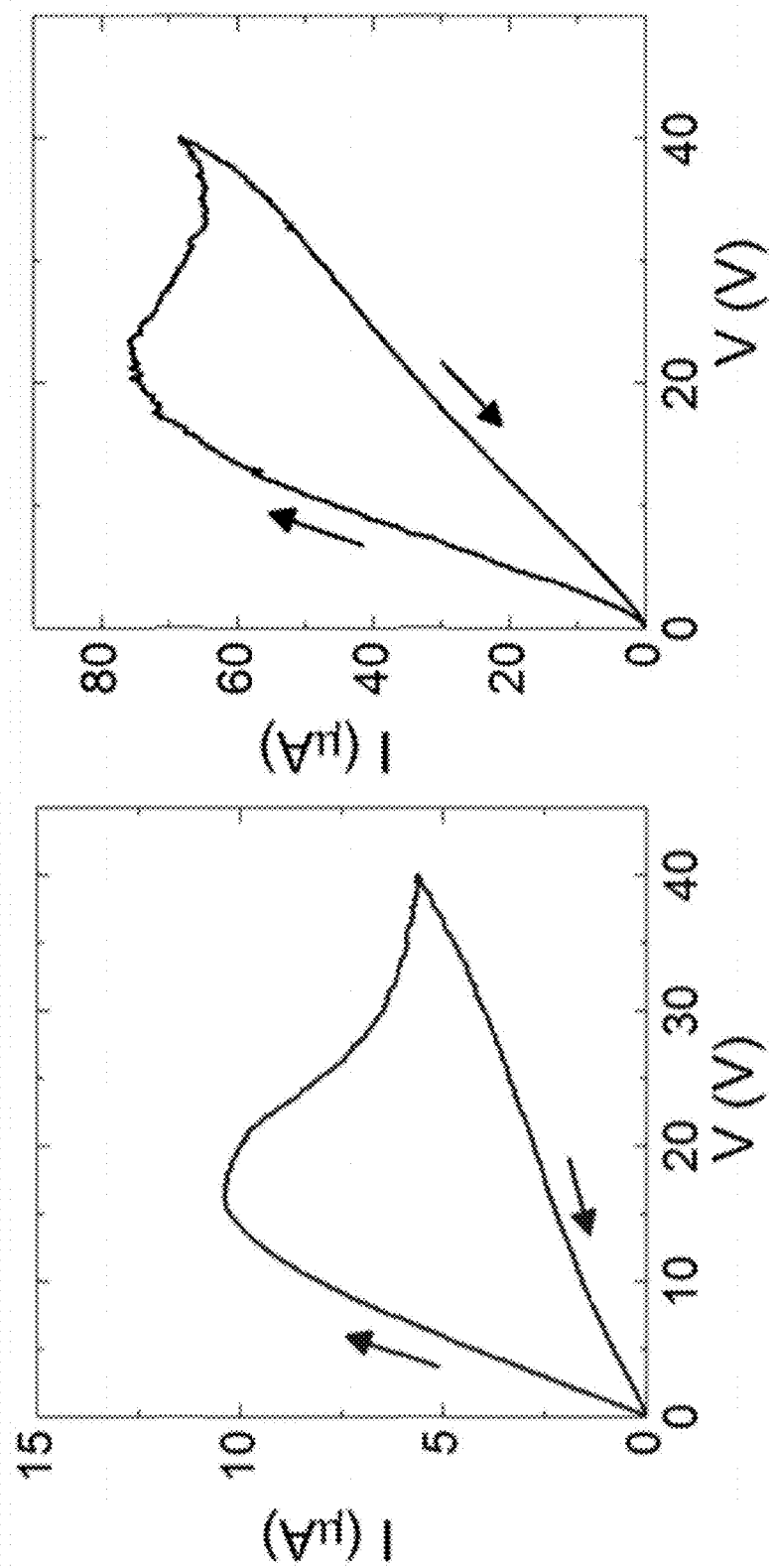
FIG. 14A is I-V characteristics of a bisecting-GB memristor (channel length L=8 µm) at $V_g$=50 V with 10 nm Ti/50 nm Au contact electrodes.
FIG. 14B is I-V characteristics of a bisecting-GB memristor (L=2 µm) at $V_g$=60 V with 2 nm Ti/70 nm Au contact electrodes.

In certain embodiments, bisecting-GB devices were also fabricated using Ti contacts (10 nm Ti/50 nm Au) instead of Au contacts exhibited nominally identical memristor behaviors, ruling out a significant electrochemical effect of metal cations [4]. FIG. 14A shows I-V characteristics of a bisecting-GB memristor (channel length L=8 nm) at $V_g$=50 V with 10 nm Ti/50 nm Au contact electrodes, while FIG. 14B shows I-V characteristics of a bisecting-GB memristor (L=2 μm) at $V_g$=60 V with 2 nm Ti/70 nm Au contact electrodes. Note that a 2 nm thick Ti adhesion layer was used in all Au-contacted memristors to facilitate the lift-off process; however, at such small thicknesses Ti is not expected form a continuous film and the electrical contact with $MoS_2$ is predominately formed by the thicker Au film (70 nm). The differences in absolute current values arise from a different channel size and different contact resistance. In general, Ti-contacted $MoS_2$ devices show increased non-linearity in low-bias I-V characteristics suggesting a larger Schottky barrier [10, 23].

Bipolar Resistive Switching

Memristors can switch either in a bipolar mode or in an unipolar (also called nonpolar) mode [4, 6]. In bipolar resistive switching, opposite voltage polarity sweeps are required to achieve 'ON' and 'OFF' states. Unipolar switching does not have that requirement and can show 'ON' and 'OFF' states within a sweep of the same polarity [4, 25]. Here, $MoS_2$ memristors show bipolar resistive switching where a negative voltage sweep (RESET) is necessary to achieve SET switching in the subsequent positive voltage sweep. FIG. 15A shows I-V characteristics of a bisecting-GB memristor with four bias sweeps in both polarities at different $V_g$ ($1^{st}$: $V_g$=55 V, $2^{nd}$: $V_g$=50 V, $3^{rd}$: $V_g$=45 V, and $4^{th}$: $V_g$=40 V) where the memristor voltage is swept in the order 0 V→50 V→0 V→−20 V→0 V. Note that the maximum negative voltage was limited to −20 V to avoid dielectric breakdown of the $SiO_2$ gate dielectric. All sweeps show a switching ratio ($R_{HRS}/R_{LRS}$) in the range 4-6. In contrast, when the device is not biased to a negative voltage sweep in between positive voltage sweeps (i.e., 0 V→50 V→0 V), the second and all subsequent I-V characteristics show significantly reduced hysteresis without dynamic NDR, as shown in FIG. 15B, showing the I-V characteristics of the device four sweeps of only positive polarity.

Interchanging the source and drain electrodes in an electroformed bisecting-GB memristor (the source electrode is always grounded) reduces the hysteresis in the I-V characteristics and removes the dynamic NDR feature (FIG. 13C). Switching back the electrodes to the original configuration returns the original memristive response, see FIG. 15C showing the I-V characteristics of the device with interchanged and original electroforming electrode configurations. Thus, the $MoS_2$ memristors operate in bipolar resistive switching mode.

Figure 16B:
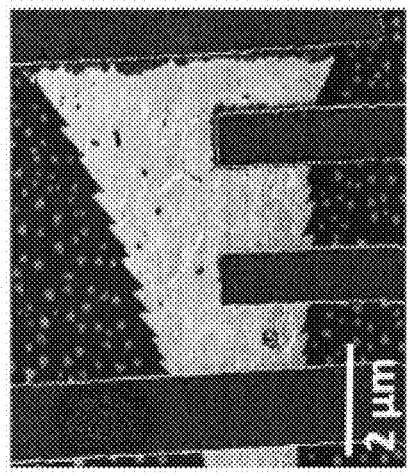
FIGS. 16B and 16C are an AFM phase image and a PL intensity map (area under peaks A and B, shown in FIG. 20A) of the channel after electrical measurements, respectively.
Figure 16D:
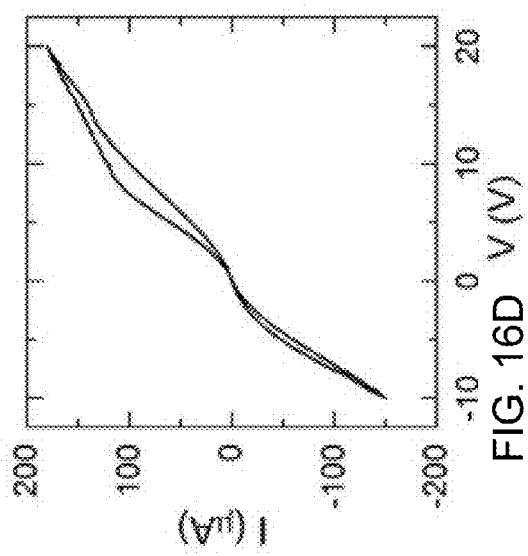
FIG. 16D is I-V characteristics of the control devices after five rounds of high-bias sweeps at V$_g$=40 V (sweep rate=1 V/sec).
Figure 16A:
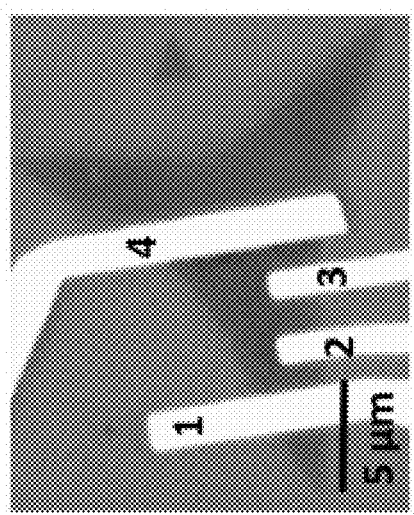
FIG. 16A is an optical micrograph of a control device fabricated on a MoS$_2$ flake without a grain boundary. Electrical measurements were conducted between electrodes '1' and '4' while electrodes '2' and '3' were kept floating throughout.
Figure 16C:
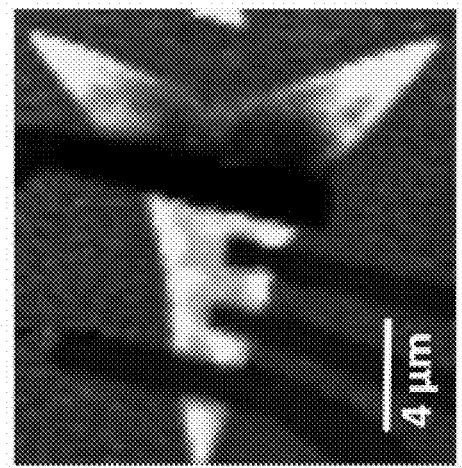

Control $MoS_2$ Devices without Grain Boundaries do not Show Memristive Behavior Control $MoS_2$ devices were fabricated without grain boundaries on one of the prongs of $MoS_2$ flakes such that there were no grain boundaries between the two electrodes. FIG. 16A is an optical micrograph of the control device fabricated on a $MoS_2$ flake without a grain boundary. Electrical measurements were conducted between electrodes '1' and '4' while electrodes '2' and '3' were kept floating throughout. FIGS. 16B and 16C are an AFM phase image and a PL intensity map (area under peaks A and B, shown in FIG. 20A) of the channel after electrical measurements, respectively. FIG. 16D is I-V characteristics of the control devices after five rounds of high-bias sweeps at $V_g$=40 V (sweep rate=1 V/sec). As shown in FIG. 16B, the AFM image of the control device after electrical measurements reveals no discernible evidence of grain boundaries. The devices show negligible hysteresis in I-V characteristics even after five sweeps at high bias voltages (20 V to −10 V), as shown in FIG. 16D, and dynamic NDR was not observed. The devices without grain boundaries showed an increased tendency to fail at high biases, and thus, biasing was limited to 20 V. The PL intensity map does not show enhanced emission between the electrodes in contrast to the PL maps of grain boundaries in electroformed memristors. However, decreased PL intensity is observed outside the channel area that also correlates with optical contrast (on the right side of the flake in FIGS. 16A and 16C), but this region has no influence on device characteristics.

Figure 17A:
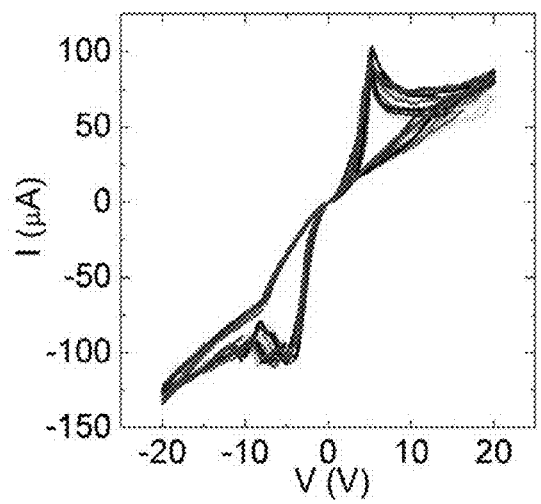
FIG. 17A is 15 sweeps of a bridge-GB memristor.
Figure 17B:
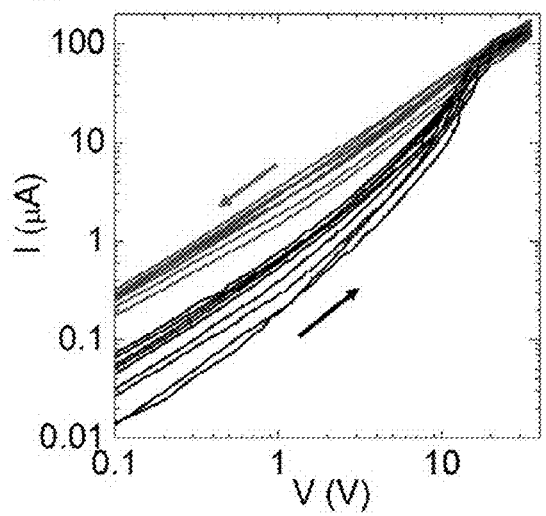
FIGS. 17B and 17C are 10 sweeps of an intersecting-GB memristor in the positive bias regime on a log-log plot. Plots in FIGS. 17B and 17C show the same data. Sweep directions are color coded in FIG. 17B and different sweeps are color coded in FIG. 17C.
Figure 17C:
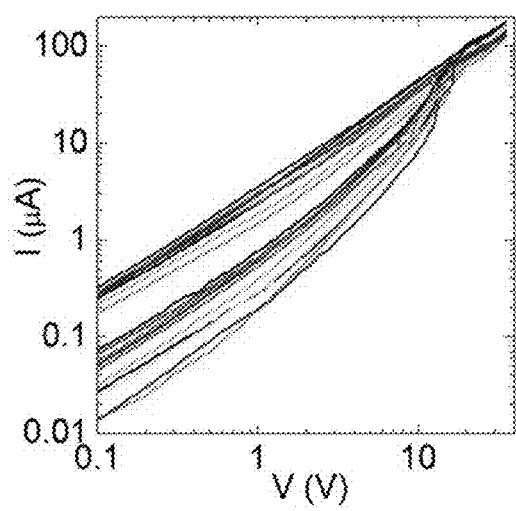
Figure 18A:
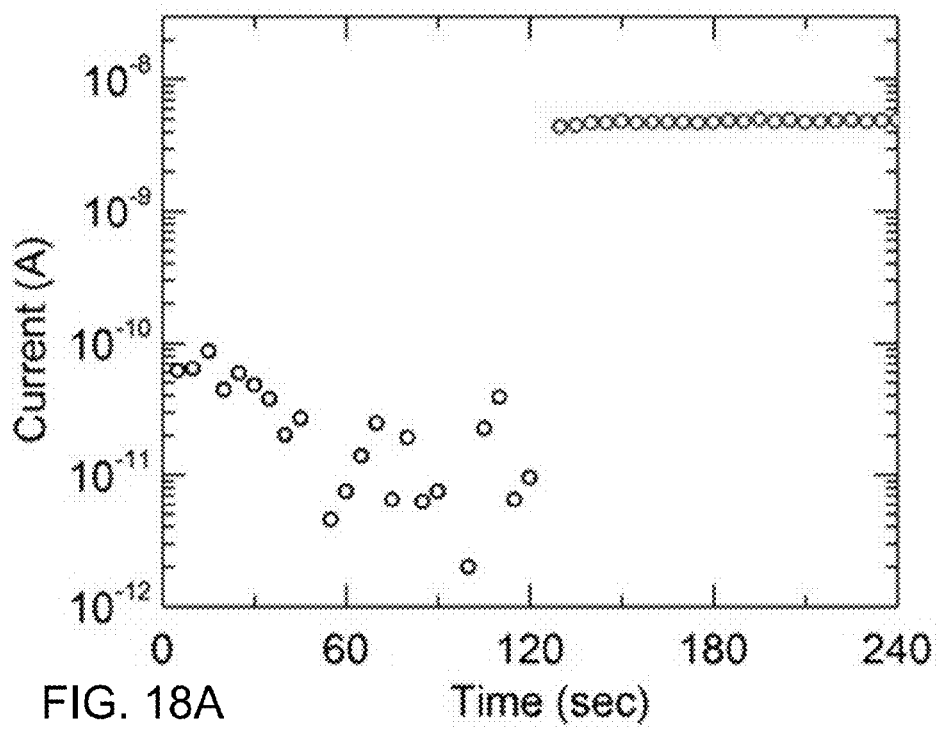
FIG. 18A is a device current in the 'ON' and 'OFF' states at V=5 mV with respect to time.
Figure 18B:
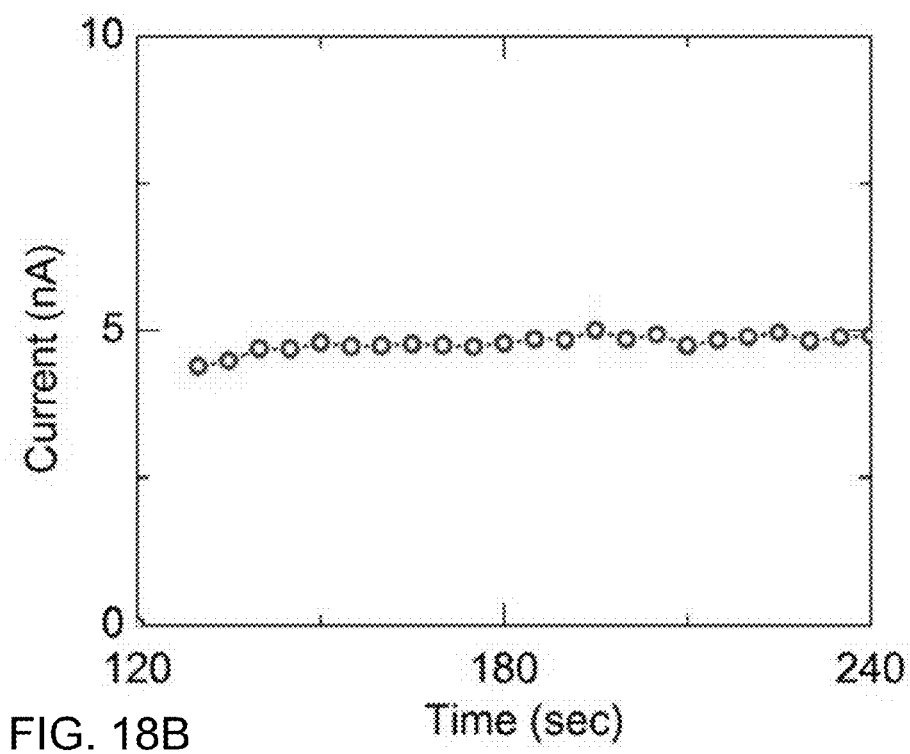
FIG. 18B is a zoomed part of the 'ON' state on a linear current scale showing relatively constant 'ON' current with time.

Multiple Sweeps and Retention Time Data $MoS_2$ memristors were swept multiple times to verify reproducible characteristics. Furthermore, the change in the resistance states was also recorded with respect to time. FIG. 17A show 15 sweeps of a bridge-GB memristor showing reproducible characteristic current peaks and NDR regime. Similarly, FIGS. 17B and 17C show 10 sweeps of an intersecting-GB memristor in the positive bias regime on a log-log plot. FIG. 17B contains the retention data of the intersecting-GB memristor. The device was biased at 5 mV to minimize current induced heating of the device during measurements. FIG. 18A is a device current in the 'ON' and 'OFF' states at V=5 mV with respect to time, while FIG. 18B is a zoomed part of the 'ON' state on a linear current scale showing relatively constant 'ON' current with time. The device showed a switching ratio>100 where the 'OFF' current remained at the noise floor of measurement (Keithley source-meter 2400). Neither 'OFF' nor 'ON' state showed any significant current decay for up to 120 seconds. The device was left unbiased for 4 hours and then both the 'ON' and 'OFF' states were measured. The 'OFF' state remained at the noise floor (10 pA) whereas the 'ON' state decayed by only 15%.

Electrostatic Force Microscopy (EFM)

The phase shift ($\Delta\Phi$) in non-contact EFM depends on the difference between tip bias voltage ($V_{tip}$) and the local potential at the surface ($V_{surface}$) as follows [38]:

$$\Delta\Phi = \frac{Q}{2k} C''(V_{tip} - V_{surface})^2$$

where C" is the second derivative of the capacitance, and Q and k are the quality factor and the spring constant of the cantilever, respectively. Spatial variations in the phase signal of EFM of a device under bias can be used to identify regions of constant and changing electrostatic potential.

FIG. 19A is an EFM phase image of the bisecting-GB memristor shown in FIG. 5C at the following biasing conditions: $V_{drain}$=5 V, $V_{tip}$=$V_{source}$=$V_g$=0 V. Dashed white line shows the edge of the contact. FIG. 19B is a zoomed-in EFM phase image of the grain boundary enclosed by the light blue rectangle in FIG. 19A in rainbow color scale. Granular features on the left portion of the image are from processing residues. FIG. 19C is a phase profile along the dark blue line in FIG. 19A showing variation across metal-$MoS_2$ edges and the grain boundary. Vertical red lines correspond to the edges of the contacts. The large peak in phase at the left contact edge is an artifact of the scanning direction from left to right. EFM phase images of an electroformed bisecting-GB memristor, as shown in FIGS. 19A-19C, show that a significantly large fraction of phase shift (>0.9) occurs across the grain boundary. The width of the region showing a phase shift remains relatively constant along the grain boundary, as shown in FIG. 19B, suggesting uniformity in local resistance along the boundary. FIG. 19D is I-V characteristics of the device in a $N_2$ environment at $V_g$=0 V. Since, $V_{tip}$ remains constant, the local surface potential and thus, resistivity varies as a square root of the variation in the EFM phase signal. Thus, more than 94% (about $0.9^{0.5}$) of the total device resistance ($R_{total}$ about 3 GΩ at V=5 V, $V_g$=0 V, FIG. 19D) comes from the grain boundary. Note that the device is in sub-threshold regime due to a shift in threshold voltage in $N_2$ environment. The device in ambient shows three times larger resistance compared to that in $N_2$, suggesting significant effects from ambient adsorbates such as $O_2$ and $H_2O$. Note that the phase shift across the grain boundary spans a region of about 100 nm, suggesting spatially extended segregation of defects in electroformed device.

Correlated Photoluminescence and Raman Microscopy

Figure 20A:
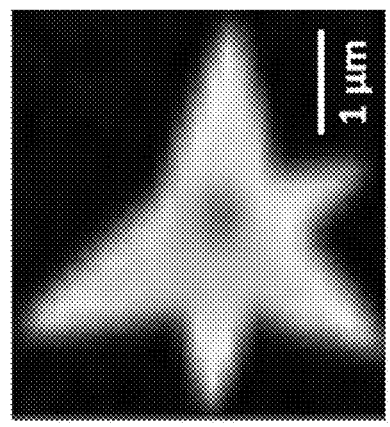
FIG. 20A is photoluminescence spectra of an as-grown MoS$_2$ flake.
Figure 20B:
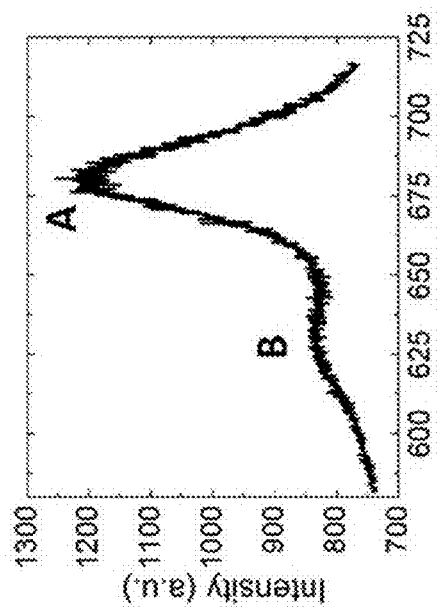
FIGS. 20B and 20C are PL maps of three MoS$_2$ flakes with grain boundaries used for memristor devices.
Figure 20C:
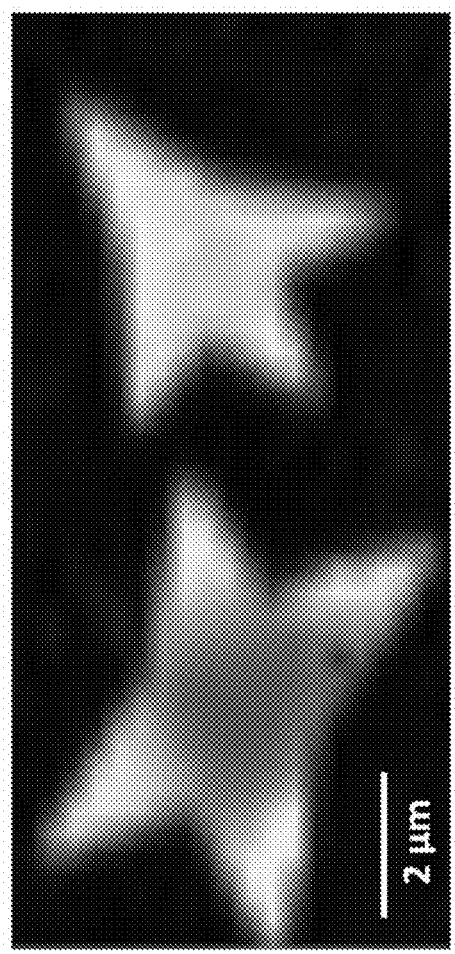

FIG. 20A shows photoluminescence spectra of an as-grown $MoS_2$ flake. FIGS. 20B and 20C are micro-photoluminescence (PL) maps of three $MoS_2$ flakes with grain boundaries used for memristor devices. PL spectroscopy of CVD-grown monolayer $MoS_2$ in ambient reveals two characteristic peaks corresponding to the two direct excitonic levels, A and B at the K point of the Brillouin zone [19, 39]. The PL peaks are broader than those in exfoliated flakes [39] due to larger structural inhomogeneity in CVD-grown $MoS_2$, as has been reported previously [11, 20, 40]. In contrast to the uniform PL in highly stoichiometric $MoS_2$ grown at high sulfur vapor pressure [11, 19], the present monolayer $MoS_2$ flakes show increased spatial non-uniformity of the PL intensity within the flakes, as shown in FIGS. 20B and 20C. In general, flakes show darker regions in the center and brighter regions in the outer branches, as shown in FIG. 20C. However, in contrast to more stoichiometric polycrystalline $MoS_2$ [11], we are not able to distinguish the grain boundary regions in spatial PL maps of pristine $MoS_2$ flakes grown at low sulfur vapor pressures [19]. Furthermore, the degree of non-uniformity varies between flakes.

Figure 21A:
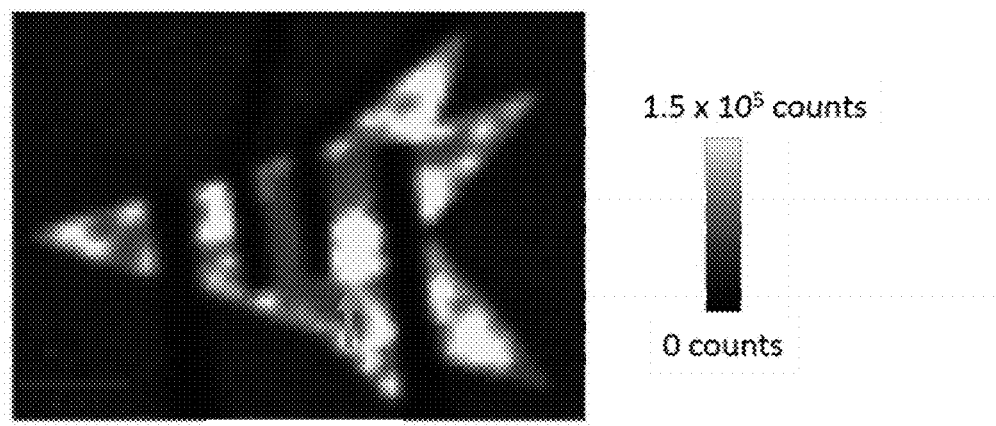
FIG. 21A is a spatial map of the sum of the areas under peaks A and B (range 585-715 nm, see FIG. 17A) of an electroformed intersecting-GB memristor. Increased PL intensity in the grain boundaries is highlighted by a dark arrow (see FIGS. 10C and 10D for AFM images of the intersecting grain boundaries).
Figure 21B:
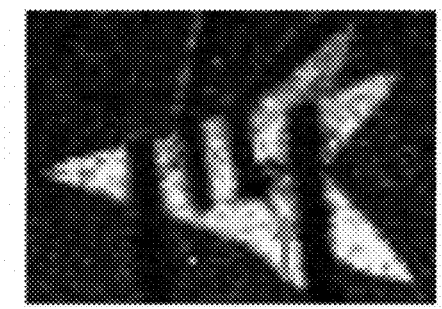
FIG. 21B is a spatial map of the integrated area under peak B (range 590-646 nm) showing decreased PL intensity in the grain boundary.
Figure 21C:
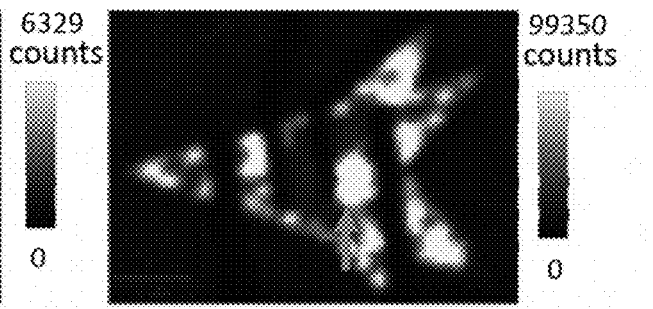
FIG. 21C is a spatial map of the area under peak A (range 646-710 nm) showing strongly enhanced PL in the grain boundary.
Figure 21D:
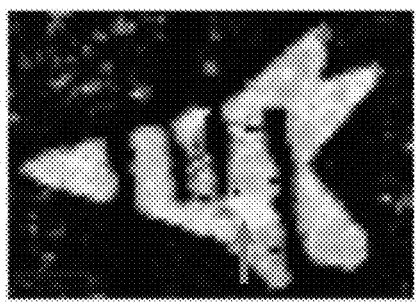
FIG. 21D is a spatial map of the FWHM of peak A.
Figure 21E:
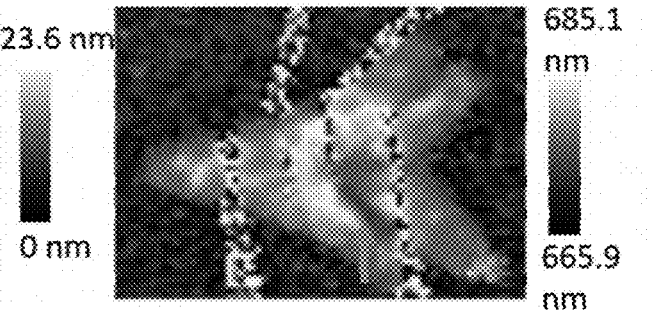
FIG. 21E is a spatial map of the peak emission wavelength for peak A.

FIG. 21A is a spatial map of the sum of the areas under peaks A and B (range 585-715 nm) of an electroformed intersecting-GB memristor. Increased PL intensity in the grain boundaries is highlighted by a dark arrow. FIG. 21B is a spatial map of the integrated area under peak B (range 590-646 nm) showing decreased PL intensity in the grain boundary. FIG. 21C is a spatial map of the area under peak A (range 646-710 nm) showing strongly enhanced PL in the grain boundary. FIG. 21D is a spatial map of the FWHM of peak A. FIG. 21E is a spatial map of the peak emission wavelength for peak A. Spatial PL mapping of the electroformed memristors shows increased integrated PL intensity (areas under peaks A and B is greater) near the grain boundaries, as shown in FIGS. 21A and 22C. The spatial maps of the A and B peaks, as shown in FIGS. 21B and 21C, reveal that while the intensity of the peak B is decreased slightly near the grain boundary (FIG. 21B), the intensity of peak A is strongly enhanced in the grain boundary regions (FIG. 21C). The FWHM in peak A remains relatively uniform across the flake (FIG. 21D). However, the position of peak A showed a significant blue shift (about 19.2 nm) in the grain boundary regions (FIG. 21E). Thus, increased PL intensity correlates with a blue shift in the dominant peak A of the grain boundaries.

FIGS. 22A and 22B are AFM topography and phase images of the bridge-GB memristor shown in FIG. 3A, respectively. Scales on the top and left edges are in micrometers. FIG. 22C is a spatial map of the integrated area under the PL peaks A and B (range 585-715 nm).

Figure 23B:
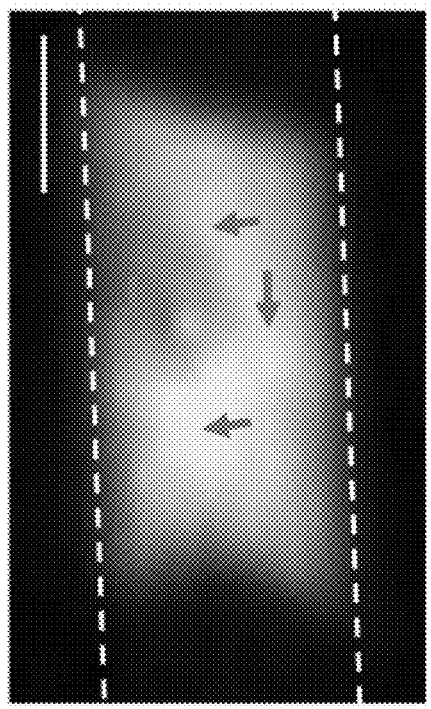
FIG. 23B is a spatial map of the sum of the areas under PL peaks A and B (range 585-715 nm) of the device including a bisecting-GB as well as a bridge-GB before electroforming.
Figure 23C:
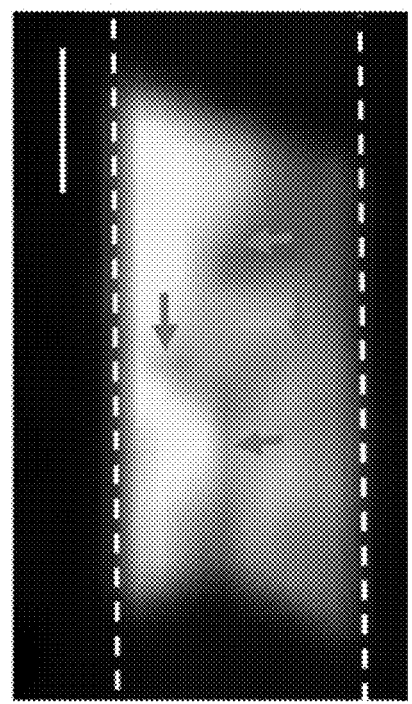
FIG. 23C is a spatial map of the integrated area under PL peaks A and B (range 585-715 nm) of the same device after electroforming. The location of grain boundaries are highlighted by the arrows in FIGS. 23A-23C. Dashed white lines in FIGS. 23B and 23C show the edges of the electrodes. Solid white scale bars in FIGS. 23B and 23C correspond to 2 μm.
Figure 23A:
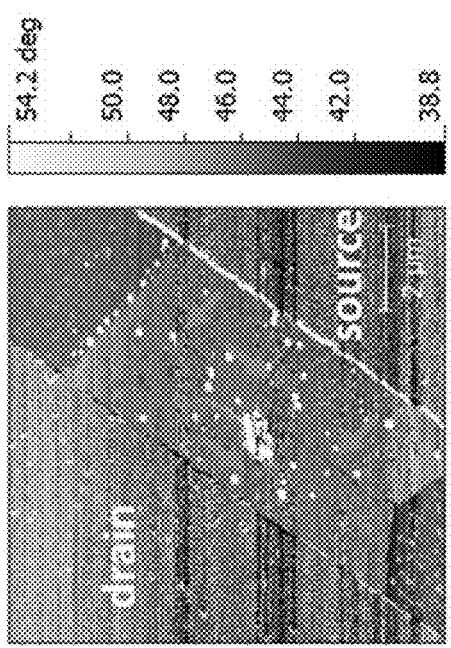
FIG. 23A is an AFM phase image of an as-fabricated device containing both a bridge-GB and a bisecting-GB.

FIG. 23A is an AFM phase image of an as-fabricated device containing both a bridge-GB and a bisecting-GB. FIG. 23B is a spatial map of the sum of the areas under PL peaks A and B (range 585-715 nm) of the device including a bisecting-GB as well as a bridge-GB before electroforming. FIG. 23C is a spatial map of the integrated area under PL peaks A and B (range 585-715 nm) of the same device after electroforming. The location of grain boundaries are highlighted by the arrows in FIGS. 23A-23C. Dashed white lines in FIGS. 23B and 23C show the edges of the electrodes. Solid white scale bars in FIGS. 23B and 23C correspond to 2 µm.

PL imaging of bisecting-GB devices reveals qualitative different behavior. PL maps are spatially uniform and do not reveal grain boundaries before electroforming, which is consistent with the PL maps of pristine flakes in FIG. 20. However, PL maps of the electroformed device show increased non-uniformity within the flake. In contrast to bridge-GB and intersecting-GB devices, the PL intensity is decreased in the grain boundary regions of bisecting-GB devices and is asymmetric with respect to the grain boundary. Moreover, there is negligible shift in the PL peaks in the bisecting-GB device.

FIG. 24A is a Raman spectrum of a bridge-GB memristor in a region away from the grain boundary. FIG. 24B is a spatial map of the Raman intensity of a bridge-GB memristor showing increased in the grain boundary highlighted by a light blue arrow. FIG. 24C is a spatial map of the Raman shift showing a blue shift of about 1.7 $cm^{-1}$ in the grain boundary. FIG. 24D is a zoomed-in map of the Raman shift in the grain boundary enclosed by the dashed rectangle in FIG. 24C.

Raman spectra were acquired in the confocal geometry with a 100×(0.90 NA) microscope objective. $MoS_2$ films were excited using a 532 nm laser with a power of 75 μW and a spot size of less than 1 μm. Raman light was dispersed on an 1800 groves/mm holographic grating. Raman spectra of as-grown $MoS_2$ flakes show that the energy difference between $A_{1g}$ and $E^1_{2g}$ is less than 20 $cm^{-1}$, as expected for monolayer $MoS_2$ (FIG. 24A) [41]. In addition, a spatial map of the Raman intensity (i.e., the integrated area under the peaks $A_{1g}$ and $E^1_{2g}$) shows reduced intensity in the grain boundary region of electroformed memristors (FIG. 24B). Decreased Raman intensity also correlates well with a Raman blue shift of 1.7 $cm^{-1}$ for the $A_{1g}$ peak in the grain boundary region (FIGS. 24C and 24D).

The correlated PL and Raman microscopy of the electroformed $MoS_2$ memristors provide insight into the spatial location of defects responsible for the operation of these devices. The observed PL in enhancement, PL shift and Raman shift can be explained by interaction of ambient specific with defects in the grain boundary region. The PL measurements were conducted under ambient conditions and increased PL intensity as well as blue shift in PL peak A (about 52 meV, FIG. 21E) is consistent with the effects $O_2$ molecule on adsorbed in grain boundaries [20]. In addition, Raman blue shift of about 1.5 $cm^{-1}$ is also in agreement with increased p-doping of $MoS_2$ from adsorbed $O_2$ [20].

Previously, correlated PL and chemical analysis of CVD-grown monolayer $MoS_2$ in ultra-high vacuum (pressure<$10^{-9}$ Torr) showed an inverse relation between the PL intensity and the density of sulfur vacancies created by controlled sputtering of Argon ions [40]. Specifically, a 10% decrease in overall sulfur content (i.e., the ratio in S 2p and Mo 3d 3/2 peaks in X-ray photoelectron spectroscopy) quenched the PL intensity of 80% [40]. In this case, defect-induced PL quenching is attributed to an increased likelihood of non-radiative recombination of excitons. On the other hand, controlled defect creation in exfoliated $MoS_2$ flakes via irradiation of alpha particles showed increasing PL intensity with defect density. However, this effect was only observed at higher pressures, but not under vacuum [42]. Similarly, increased PL intensity was found along the cracks in monolayer $MoS_2$ containing sulfur vacancies. Again this effect was only seen in ambient conditions, not under vacuum [20]. Thus, intrinsic defects in $MoS_2$ alone do not lead to enhanced PL, but, as also supported by theoretical calculations [20, 42], PL enhancement results from interactions between sulfur vacancies and physisorbed $N_2$ and chemisorbed $O_2$ molecules. Furthermore, p-type doping from absorbed $O_2$ on defect sites in $MoS_2$ results in a blue shift in the PL peak A by about 40 meV as well as a blue shift in the Raman peak $A_{1g}$ by about 1 $cm^{-1}$ [20]. Thus, correlated analyses of PL and Raman spectroscopy, in conjecture with EFM analysis provide multiple evidences of increased defect density near the grain boundaries of electroformed devices.

Briefly, the invention recites, among other things, a new class of memristors based on GBs in atomically thin film devices. Specifically, the resistance of grain boundaries emerging from contacts can be easily and repeatedly modulated, with switching ratios up to about $10^3$ and dynamic negative differential resistance. Furthermore, the atomically thin nature of the thin film enables tuning of the SET voltage by a third gate terminal in a field-effect geometry, providing new functionality not observed in other known memristive devices.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments were chosen and described in order to explain the principles of the invention and their practical application so as to activate others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

LIST OF REFERENCES

[1]. Linn, E., Rosezin, R., Kügeler, C. & Waser, R. Complementary resistive switches for passive nanocrossbar memories. *Nature Mater.*, 9 403-406 (2010).

[2]. Theis, T. N. & Solomon, P. M. In quest of the next switch: Prospects for greatly reduced power dissipation in a successor to the silicon field-effect transistor. *Proc. IEEE*, 98 2005-2014 (2010).

[3]. Waser, R. & Aono, M. Nanoionics-based resistive switching memories. *Nature Mater.*, 6 833-840 (2007).

[4]. Yang, J. J., Strukov, D. B. & Stewart, D. R. Memristive devices for computing. *Nature Nanotech.*, 8 13-24 (2013).

[5]. Chua, L. Memristor—the missing circuit element. *IEEE Trans. Circuit Theory*, 18 507-519 (1971).

[6]. Strukov, D. B., Snider, G. S., Stewart, D. R. & Williams, R. S. The missing memristor found. *Nature*, 453 80-83 (2008).

[7]. Chua, L. Resistance switching memories are memristors. *Appl. Phys. A*, 102 765-783 (2011).

[8]. Borghetti, J., et al. 'Memristive' switches enable 'stateful' logic operations via material implication. *Nature*, 464 873-876 (2010).

[9]. Yang, J. J., et al. Memristive switching mechanism for metal/oxide/metal nanodevices. *Nature Nanotech.*, 3 429-433 (2008).

[10]. Jariwala, D., Sangwan, V. K., Lauhon, L. J., Marks, T. J. & Hersam, M. C. Emerging device applications for semiconducting two-dimensional transition metal dichalcogenides. *ACS Nano*, 8 1102-1120 (2014).

[11]. van der Zande, A. M., et al. Grains and grain boundaries in highly crystalline monolayer molybdenum disulphide. *Nature Mater.*, 12 554-561 (2013).

[12]. Radisavljevic B., Radenovic A., Brivio J., Giacometti V. & Kis A. Single-layer $MoS_2$ transistors. *Nature Nanotech.*, 6 147-150 (2011).

[13]. Pickett, M. D., Borghetti, J., Yang, J. J., Medeiros-Ribeiro, G. & Williams, R. S. Coexistence of memristance and negative differential resistance in a nanoscale metal-oxide-metal system. *Adv. Mater.*, 23 1730-1733 (2011).

[14]. Xia, Y., He, W., Chen, L., Meng, X. & Liu, Z. Field-induced resistive switching based on space-charge-limited current. *Appl. Phys. Lett.*, 90 022907 (2007).

[15]. Ghatak, S. & Ghosh, A. Observation of trap-assisted space charge limited conductivity in short channel $MoS_2$ transistor. *Appl. Phys. Lett.*, 103 122103 (2013).

[16]. Azizi, A., et al. Dislocation motion and grain boundary migration in two-dimensional tungsten disulphide. *Nature Commun.*, 5 (2014).

[17]. Najmaei, S., et al. Vapour phase growth and grain boundary structure of molybdenum disulphide atomic layers. *Nature Mater.*, 12 754-759 (2013).

[18]. Chen, M., et al. Multibit data storage states formed in plasma-treated $MoS_2$ transistors. *ACS Nano*, 8 4023-4032 (2014).

[19]. Kim, I. S., et al. Influence of stoichiometry on the optical and electrical properties of chemical vapor deposition derived $MoS_2$. *ACS Nano*, 8 10551-10558 (2014).

[20]. Nan, H., et al. Strong photoluminescence enhancement of $MoS_2$ through defect engineering and oxygen bonding. *ACS Nano* 5738-5745 (2014).

[21]. Shen, X., Puzyrev, Y. S. & Pantelides, S. T. Vacancy breathing by grain boundaries—a mechanism of memristive switching in polycrystalline oxides. *MRS Commun.*, 3 167-170 (2013).

[22]. Kim, S., Choi, S. & Lu, W. Comprehensive physical model of dynamic resistive switching in an oxide memristor. *ACS Nano*, 8 2369-2376 (2014).

[23]. Jariwala, D., et al. Band-like transport in high mobility unencapsulated single-layer $MoS_2$ transistors. *Appl. Phys. Lett.*, 102 173107 (2013).

[24]. Najmaei, S., et al. Electrical transport properties of polycrystalline monolayer molybdenum disulfide. *ACS Nano* doi: 10.1021/nn501701a (2014).

[25]. Chang, S., et al. Occurrence of both unipolar memory and threshold resistance switching in a NiO film. *Phys. Rev. Lett.*, 102 026801 (2009).

[26]. Yang, Y., Sheridan, P. & Lu, W. Complementary resistive switching in tantalum oxide-based resistive memory devices. *Appl. Phys. Lett.*, 100 203112 (2012).

[27]. Park, J.-W., et al. Resistive switching characteristics and set-voltage dependence of low-resistance state in sputter-deposited $SrZrO_3$:Cr memory films. *J. Appl. Phys.*, 99 (2006).

[28]. Aoki, Y., et al. Bulk mixed ion electron conduction in amorphous gallium oxide causes memristive behaviour. *Nature Commun.* doi: 10.1038/ncomms4473 (2014).

[29]. Likharev, K. K. Hybrid CMOS/nanoelectronic circuits: Opportunities and challenges. *J. Nanoelect. & Optoelec.*, 3 203-230 (2008).

[30]. Linn, E., Rosezin, R., Tappertzhofen, S., Böttger, U. & Waser, R. Beyond von Neumann—logic operations in passive crossbar arrays alongside memory operations. *Nanotechnology*, 23 305205 (2012).

[31]. Snider, G. S. Self-organized computation with unreliable, memristive nanodevices. *Nanotechnology*, 18 365202 (2007).

[32]. Xia, Q., et al. Memristor—CMOS hybrid integrated circuits for reconfigurable logic. *Nano Lett.*, 9 3640-3645 (2009).

[33]. Kim, I. S., et al. Influence of stoichiometry on the optical and electrical properties of chemical vapor deposition derived $MoS_2$. *ACS Nano* doi: 10.1021/nn503988x (2014).

[34]. Sangwan, V. K., et al. Low-frequency electronic noise in single-layer $MoS_2$ transistors. *Nano Lett.*, 13 4351-4355 (2013).

[35]. Yin, X., et al. Edge nonlinear optics on a $MoS_2$ atomic monolayer. *Science*, 344 488-490 (2014).

[36]. Zhang, Y., et al. Controlled Growth of High-Quality Monolayer $WS_2$ Layers on Sapphire and Imaging Its Grain Boundary. *ACS Nano*, 7 8963-8971 (2013).

[37]. Ly, T. H., et al. Observing Grain Boundaries in CVD-Grown Monolayer Transition Metal Dichalcogenides. *ACS Nano*, 8 11401-11408 (2014).

[38]. Burnett, T., Yakimova, R. & Kazakova, O. Mapping of local electrical properties in epitaxial graphene using electrostatic force microscopy. *Nano Lett.*, 11 2324-2328 (2011).

[39]. Mak, K. F., Lee, C., Hone, J., Shan, J. & Heinz, T. F. Atomically thin $MoS_2$: A new direct-gap semiconductor. *Phys. Rev. Lett.*, 105 136805 (2010).

[40]. Ma, Q., et al. Controlled argon beam-induced desulfurization of monolayer molybdenum disulfide. *J. Phys.: Condens. Matter*, 25 252201 (2013).

[41]. Lee, C., et al. Anomalous lattice vibrations of single- and few-layer MoS2. *ACS Nano*, 4 2695-2700 (2010).

[42]. Tongay, S., et al. Defects activated photoluminescence in two-dimensional semiconductors: interplay between bound, charged, and free excitons. *Scientific Reports*, 3 2657 (2013).

What is claimed is:

1. A memristor, comprising:
   a substrate having a first surface and an opposite, second surface;
   a monolayer film formed of an atomically thin material on the first surface of the substrate, wherein the monolayer film has at least one grain boundary (GB);
   a first electrode and a second electrode spatial-apart formed on the first surface of the substrate and electrically coupled with the monolayer film to define a memristor channel in the monolayer film between the first and second electrodes, such that the at least one GB is located in the memristor channel; and
   a gate electrode formed on the second surface of the substrate and capacitively coupled with the memristor channel.

2. The memristor of claim 1, wherein the atomically thin material comprises $MoS_2$, $MoSe_2$, $WS_2$, $WSe_2$, or related two-dimensional materials.

3. The memristor of claim 1, wherein the substrate is formed of oxidized silicon ($SiO_2$), or dielectrics including alumina, hafnia, or zirconia.

4. The memristor of claim 1, wherein the gate electrode is formed of highly doped silicon (Si), or other conductive materials.

5. The memristor of claim 1, wherein the first and second electrodes are formed of a same metallic material or different metallic materials.

6. The memristor of claim 5, wherein the first and second electrodes are formed of at least one of gold (Au), titanium (Ti), and other conductive materials.

7. The memristor of claim 1, wherein a resistance of the at least one GB is repeatably modulatable.

8. The memristor of claim 1, being gate-tunable, wherein a SET voltage of the memristor is tunable by a gate voltage applied to the gate electrode.

9. The memristor of claim 1, being conditioned to a switching mode by an electroforming process, wherein the switching mode is a bipolar mode, or a unipolar.

10. The memristor of claim 1, being an intersecting-GB memristor, wherein the at least one GB comprises two or more GBs connected to only one of the first and second electrodes.

11. The memristor of claim 10, wherein the intersecting-GB memristor is turned into an ON state during a SET process, and an OFF state during a RESET process.

12. The memristor of claim 1, being a bridge-GB memristor, wherein the at least one GB connects and bridges the first and second electrodes.

13. The memristor of claim 12, wherein the at least one GB is parallel to the memristor channel.

14. The memristor of claim 1, being a bisecting-GB memristor, wherein the at least one GB is across the memristor channel and connects to none of the first and second electrodes.

15. The memristor of claim 14, wherein the at least one GB is perpendicular to the channel.

16. A circuitry, comprising one or more memristors according to claim 1.

17. An electronic device, comprising one or more memristors according to claim 1.

18. A memristor, comprising:
a monolayer film formed of an atomically thin material, wherein the monolayer film has at least one grain boundary (GB); and
a first electrode and a second electrode electrically coupled with the monolayer film to define a memristor channel therebetween, such that the at least one GB is located in the memristor channel.

19. The memristor of claim 18, wherein the atomically thin material comprises $MoS_2$, $MoSe_2$, $WS_2$, $WSe_2$, or related two-dimensional materials.

20. The memristor of claim 18, wherein the first and second electrodes are formed of a same metallic material or different metallic materials.

21. The memristor of claim 20, wherein the first and second electrodes are formed of at least one of gold (Au), titanium (Ti), and other conductive materials.

22. The memristor of claim 18, further comprising a gate electrode capacitively coupled with the memristor channel.

23. The memristor of claim 22, wherein the gate electrode is formed of highly doped silicon (Si), or other conductive materials.

24. The memristor of claim 22, further comprising a dielectric layer formed between the monolayer film and the gate electrode.

25. The memristor of claim 24, wherein the dielectric layer is formed of oxidized silicon ($SiO_2$) or dielectrics including alumina, hafnia, or zirconia.

26. The memristor of claim 22, wherein a resistance of the at least one GB is repeatably modulatable.

27. The memristor of claim 22, being gate-tunable, wherein a SET voltage of the memristor is tunable by a gate voltage applied to the gate electrode.

28. The memristor of claim 22, being conditioned to a switching mode by an electroforming process, wherein the switching mode is a bipolar mode, or a unipolar.

29. The memristor of claim 18, being a bisecting-GB memristor, wherein the at least one GB is across the memristor channel and connects to none of the first and second electrodes.

30. The memristor of claim 18, being an intersecting-GB memristor, wherein the at least one GB comprises two or more GBs connected to only one of the first and second electrodes.

31. The memristor of claim 18, being a bridge-GB memristor, wherein the at least one GB connects and bridges the first and second electrodes.

32. A circuitry, comprising one or more memristors according to claim 18.

33. An electronic device, comprising one or more memristors according to claim 18.

34. A method for fabricating a memristor, comprising:
growing a monolayer film on a substrate, wherein the monolayer film has at least one grain boundary (GB); and
depositing a first electrode and a second electrode on the substrate, wherein the first and second electrodes are electrically coupled with the monolayer film to define a memristor channel therebetween such that the at least one GB is located in the memristor channel.

35. The method of claim 34, further comprising forming a gate electrode on the substrate such that the substrate is positioned between the gate electrode and the monolayer film, wherein the gate electrode is capacitively coupled with the memristor channel.

36. The method of claim 35, further comprising conditioning the memristor with an electroforming process.

37. The method of claim 34, wherein the growing step is performed by chemical vapor deposition, and wherein the depositing step is performed by thermal evaporation.

38. The method of claim 34, wherein the monolayer film comprises an atomically thin material of $MoS_2$, $MoSe_2$, $WS_2$, $WSe_2$, or related two-dimensional materials.

39. The method of claim 34, wherein the substrate is formed of oxidized silicon ($SiO_2$), or dielectrics including alumina, hafnia, or zirconia.

40. The method of claim 34, wherein the gate electrode is formed of highly doped silicon (Si), or other conductive materials.

41. The method of claim 34, wherein the first and second electrodes are formed of a same metallic material or different metallic materials.

42. The method of claim 41, wherein the first and second electrodes are formed of at least one of gold (Au), titanium (Ti), and other conductive materials.

* * * * *